US010451941B2

(12) United States Patent
Bae et al.

(10) Patent No.: US 10,451,941 B2
(45) Date of Patent: Oct. 22, 2019

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Kwang Soo Bae, Yongin-si (KR); Yong Seok Kim, Seoul (KR); Dae Ho Song, Hwaseong-si (KR); Hae Ju Yun, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/819,281

(22) Filed: Aug. 5, 2015

(65) Prior Publication Data

US 2016/0091766 A1  Mar. 31, 2016

(30) Foreign Application Priority Data

Sep. 30, 2014  (KR) .................. 10-2014-0130863

(51) Int. Cl.
| | |
|---|---|
| *G02F 1/1362* | (2006.01) |
| *G02F 1/1339* | (2006.01) |
| *H01L 27/12* | (2006.01) |
| *G02F 1/1333* | (2006.01) |
| *G02F 1/1341* | (2006.01) |

(52) U.S. Cl.
CPC ...... *G02F 1/136286* (2013.01); *G02F 1/1341* (2013.01); *G02F 1/13394* (2013.01); *G02F 1/133305* (2013.01); *G02F 1/133377* (2013.01); *H01L 27/1259* (2013.01)

(58) Field of Classification Search
CPC .......... G02F 1/133377; G02F 1/13394; G02F 1/136286
See application file for complete search history.

(56) References Cited

U.S. PATENT DOCUMENTS

| | | | |
|---|---|---|---|
| 8,169,579 B2 | 5/2012 | Kim | |
| 2003/0151715 A1* | 8/2003 | Kim | ................. G02F 1/133305 349/155 |
| 2009/0002588 A1* | 1/2009 | Lee | ................. G02F 1/133707 349/42 |
| 2009/0185094 A1* | 7/2009 | Lee | ..................... G02F 1/13394 349/46 |

(Continued)

FOREIGN PATENT DOCUMENTS

| | | |
|---|---|---|
| KR | 10-2013-0096605 A | 8/2013 |
| KR | 10-2013-0124829 A | 11/2013 |

(Continued)

OTHER PUBLICATIONS

EP15186031.9, European Search Report dated Feb. 1, 2016, 8 pages.

*Primary Examiner* — Jessica M Merlin
(74) *Attorney, Agent, or Firm* — Innovation Counsel LLP

(57) ABSTRACT

A liquid crystal display and a method of making it are provided. The liquid crystal display includes: a substrate; a thin film transistor disposed on the substrate; a pixel electrode connected to the thin film transistor; a roof layer disposed to be spaced from the pixel electrode; a liquid crystal layer between the pixel electrode and the roof layer; and a plurality of columns arranged along a gate line connected to the thin film transistor and supporting the roof layer, wherein the plurality of columns are formed of the same material as the roof layer.

8 Claims, 39 Drawing Sheets

(56) References Cited

U.S. PATENT DOCUMENTS

| | | | |
|---|---|---|---|
| 2010/0014011 A1* | 1/2010 | Mottram | G02F 1/133377 349/33 |
| 2012/0062448 A1* | 3/2012 | Kim | G02F 1/133377 345/55 |
| 2012/0268699 A1* | 10/2012 | Min | G02F 1/13394 349/106 |
| 2013/0293799 A1 | 11/2013 | Lee et al. | |

FOREIGN PATENT DOCUMENTS

| KR | 10-2014-0025739 A | 3/2014 |
|---|---|---|
| KR | 10-2014-0048459 A | 4/2014 |
| KR | 10-2014-0122884 A | 10/2014 |

* cited by examiner

LIQUID CRYSTAL DISPLAY AND METHOD OF MANUFACTURING THE SAME

CROSS-REFERENCE TO RELATED APPLICATION

This application claims priority to and the benefit of Korean Patent Application No. 10-2010-0130863 filed in the Korean Intellectual Property Office on Sep. 30, 2014, the entire contents of which are incorporated herein by reference.

BACKGROUND (a) Field

The present invention relates to a liquid crystal display and a manufacturing method thereof.

(b) Description of the Related Art

A liquid crystal display panel, which is one of the more common types of flat panel displays currently in use, includes two sheets of substrates with field generating electrodes such as a pixel electrode and a common electrode, and a liquid crystal layer interposed therebetween.

A liquid crystal display generates electric fields in the liquid crystal layer by applying voltages to the field generating electrodes, determines the alignment of liquid crystal molecules of the liquid crystal layer by the generated electric fields, and controls polarization of incident light, thereby displaying images.

As one of the liquid crystal displays, a technology for implementing a display by forming a plurality of microcavities and filling liquid crystal in the microcavities has been developed. In a conventional liquid crystal display, two sheets of substrates are used, but in this technology, constituent elements are formed on one substrate, thereby reducing weight, thickness, and the like of the device.

In order to maintain the microcavities in the display device, a roof layer is formed. Such a roof layer may be continuously connected between neighboring microcavities and may form a partition in a region overlapping signal lines. The partition has a large width compared with the signal line such that an aperture ratio may be reduced.

The above information disclosed in this Background section is only for enhancement of understanding of the background of the invention and therefore it may contain information that does not form the prior art that is already known to a person of ordinary skill in the art.

SUMMARY

The present inventive concept provides liquid crystal display with an improved aperture ratio, and a manufacturing method thereof.

A liquid crystal display according to an exemplary embodiment of the present invention includes: a substrate; a thin film transistor disposed on the substrate; a pixel electrode connected to the thin film transistor; a roof layer disposed to be spaced from the pixel electrode; a liquid crystal layer between the pixel electrode and the roof layer; and a plurality of columns arranged along a gate line connected to the thin film transistor and supporting the roof layer, wherein the plurality of columns are formed of the same material as the roof layer.

The plurality of columns may be integrated with the roof layer as one continuous body.

The gate line may include a first gate line and a second gate line adjacent to each other, an assistance column supporting the roof layer may be included between the first gate line and the second gate line, and the assistance column may overlap a data line connected to the thin film transistor.

The liquid crystal display may further include a first pixel area, a second pixel area, and a third pixel area disposed between the first gate line and the second gate line and adjacent to each other. The data line may include a first data line disposed between the first pixel area and the second pixel area and a second data line disposed between the second pixel area and the third pixel area, and the assistance column may include at least one first assistance column arranged while overlapping the first data line and at least one second assistance column arranged while overlapping the second data line.

The plurality of columns arranged along the gate line may extend across the first pixel area and the third pixel area, and are separated by the second pixel area.

The first pixel area may be a red pixel region, the second pixel area may be a green pixel region, and the third pixel area may be a blue pixel region.

A partition formed along the data line of the thin film transistor and supporting the roof layer may be further included.

Where the gate line is a first gate line, the liquid crystal display may further include a second gate line adjacent to the first gate line. The liquid crystal display may also include a first pixel area, a second pixel area, and a third pixel area disposed between the first gate line and the second gate line and adjacent to each. Where a unit pixel includes the first pixel area, the second pixel area, and the third pixel area arranged adjacent to each other, and the partition may be disposed between the third pixel area of a first unit pixel and the first pixel area of a second unit pixel.

The plurality of columns arranged along the gate line extend across the first pixel area and the third pixel area and are separated by the second pixel area.

The first pixel area may be a red pixel region, the second pixel area may be a green pixel region, and the third pixel area may be a blue pixel region.

The plurality of columns may be disposed at portions where the data line and the gate line connected to the thin film transistor cross each other.

A manufacturing method of a liquid crystal display according to an exemplary embodiment of the present inventive concept includes: forming a thin film transistor on a substrate; forming a pixel electrode connected to the thin film transistor; forming a sacrificial layer with a plurality of column holes on the pixel electrode; forming a roof layer on the sacrificial layer; removing the sacrificial layer to form a space, such that columns shaped by the column holes extend through the space and support the roof layer; injecting an alignment material into the space; and injecting a liquid crystal material into the space, wherein the columns include the same material as the roof layer.

The plurality of column holes may be formed according to a gate line connected to the thin film transistor, and the column may be formed at the column hole formed along the gate line.

Where the gate line is a first gate line and there is also a second gate line, the method may further comprising forming the plurality of column holes to overlap the data line connected to the thin film transistor between the first gate line and the second gate line.

The method may further include forming an assistance column at one of the column holes overlapping the data line.

Where the liquid crystal display includes a first pixel area, a second pixel area, and a third pixel area disposed between the first gate line and the second gate line and adjacent to each other, the method may further entail forming the plurality of columns along the gate line such that the columns extend across the first pixel area and the third pixel area and are separated by the second pixel area.

The method may include disposing the assistance column at a bent portion of the data line.

The method may further include forming a partition along the data line of the thin film transistor and supporting the roof layer.

The gate line may include a first gate line and a second gate line adjacent to each other, a first pixel area, a second pixel area, and a third pixel area disposed between the first gate line and the second gate line and adjacent to each other may be included, a unit pixel may include the first pixel area, the second pixel area, and the third pixel area arranged adjacent to each other. The method may also include disposing the partition between the third pixel area of the first unit pixel and the first pixel area of the second unit pixel.

The plurality of columns arranged along the gate line may extend across the first pixel area and the third pixel area, and be separated by the second pixel area.

The plurality of columns may be disposed at portions where the data line and the gate line connected to the thin film transistor cross each other.

The method may further include forming a common electrode disposed with the pixel electrode via an interlayer insulating layer on the substrate.

According to an exemplary embodiment of the disclosed concept, the aperture ratio may be optimized by varying the partition structure supporting the roof layer.

DETAILED DESCRIPTION OF THE EMBODIMENTS

Figure 1:
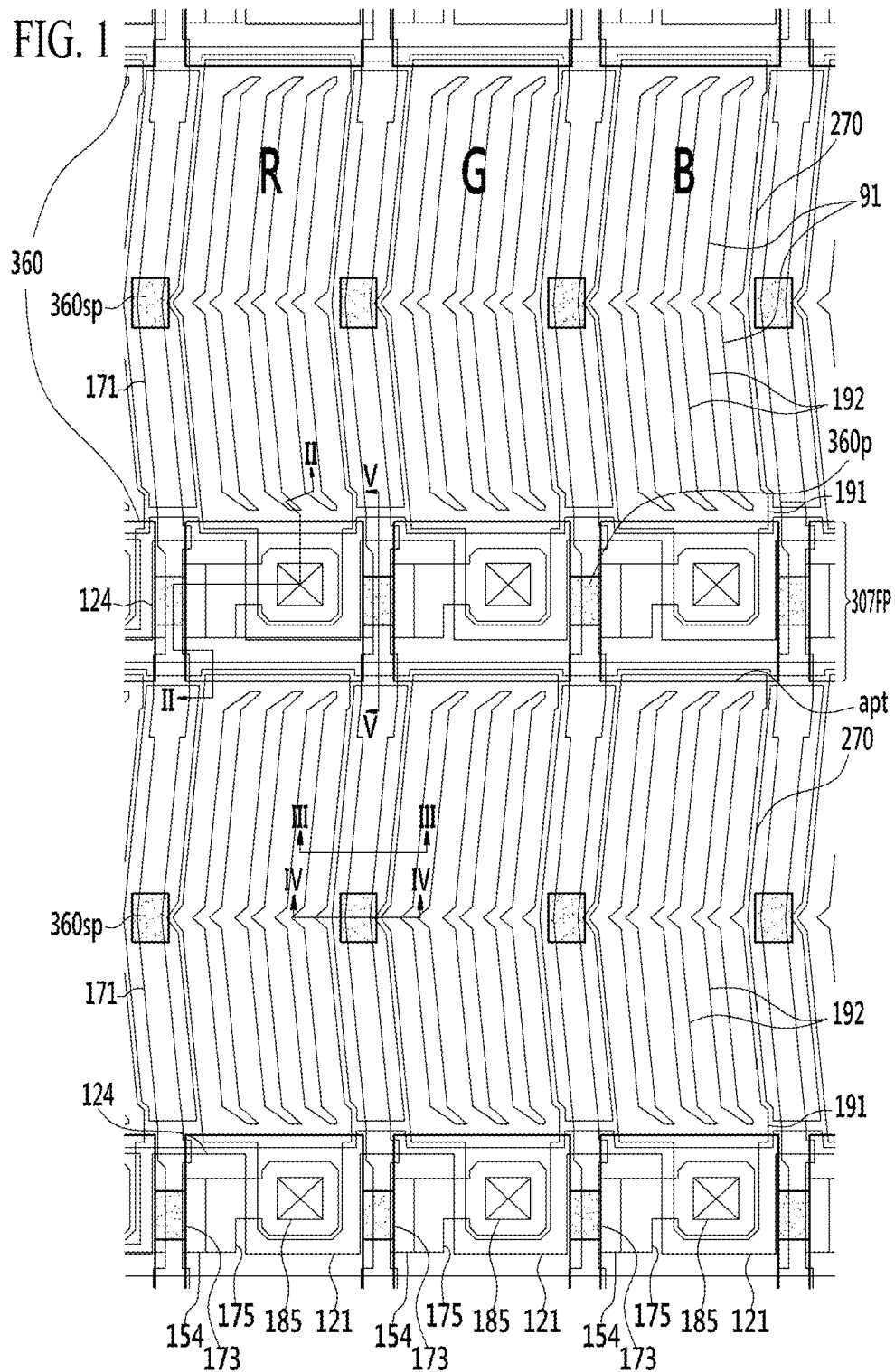
FIG. 1 is a top plan view of a liquid crystal display according to an exemplary embodiment of the present inventive concept.

The inventive concept will be described more fully hereinafter with reference to the accompanying drawings, in which exemplary embodiments of the concept are shown. However, the inventive concept is not limited to the exemplary embodiments described herein, and may be implemented in various different forms. Rather, exemplary embodiments described herein are to provide a thorough and complete understanding of the disclosed contents and to sufficiently transfer the ideas of the present inventive concept to a person of ordinary skill in the art.

In the drawings, the thickness of layers and regions is exaggerated for clarity. It is to be noted that when a layer is referred to as being "on" another layer or substrate, it can be formed directly on the other layer or substrate or can be formed with a third layer interposed therebetween. Like constituent elements are denoted by like reference numerals throughout the specification.

Figure 2:
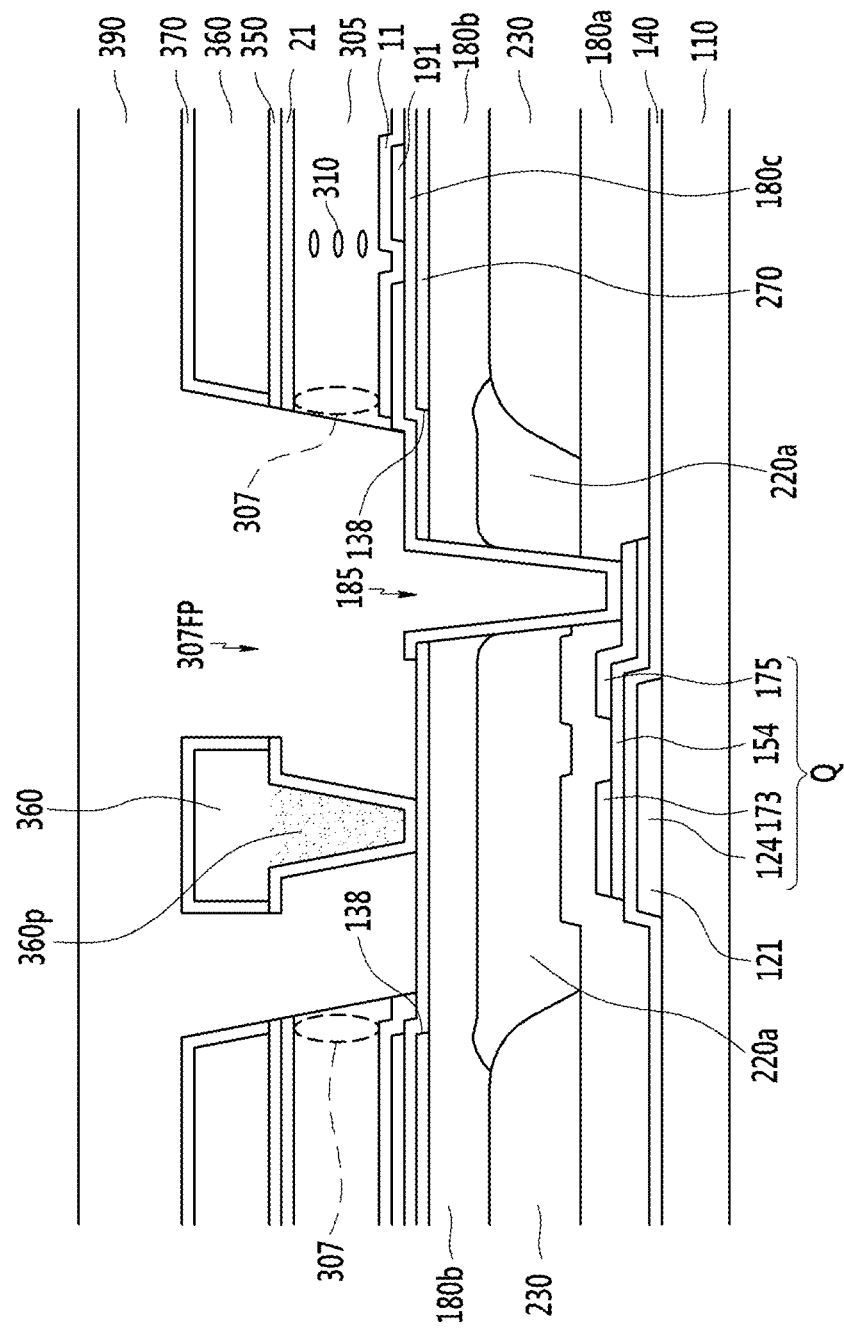
FIG. 2 is a cross-sectional view taken along a line II-II of FIG. 1.
Figure 3:
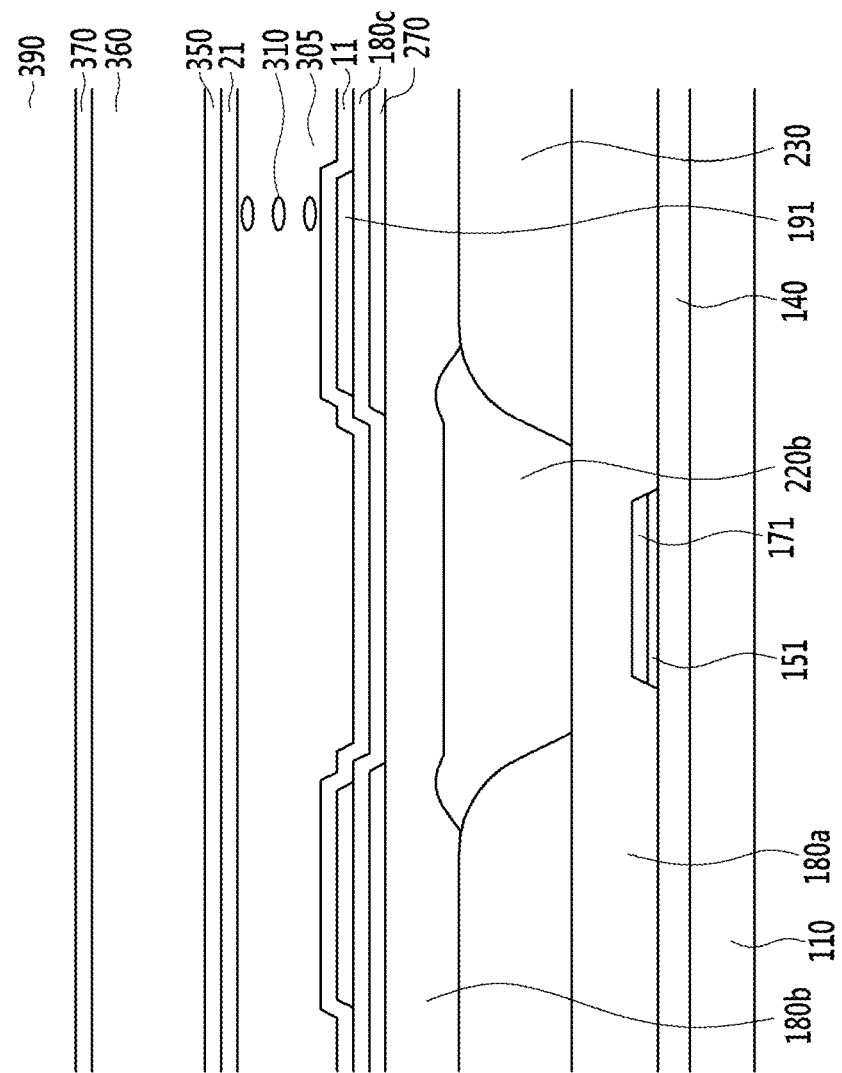
FIG. 3 is a cross-sectional view taken along a line III-III of FIG. 1.
Figure 4:
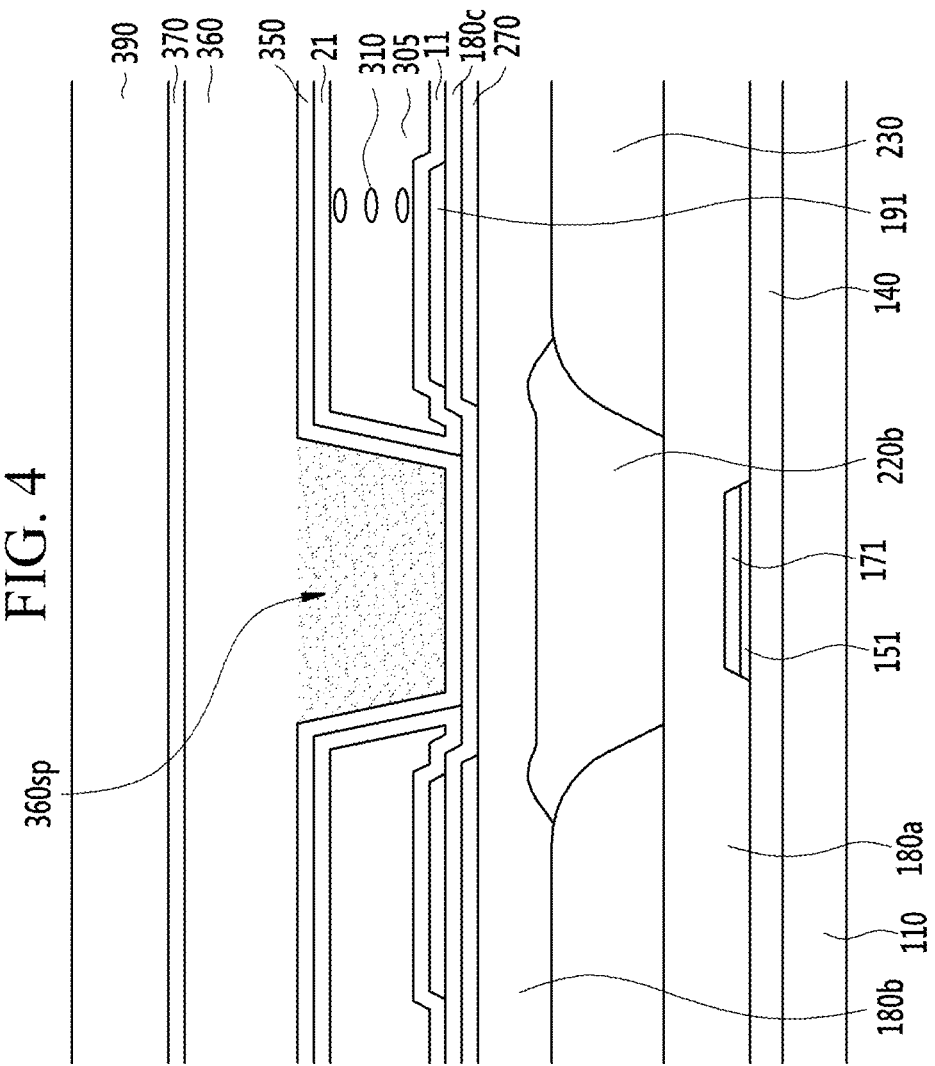
FIG. 4 is a cross-sectional view taken along a line IV-IV of FIG. 1.
Figure 5:
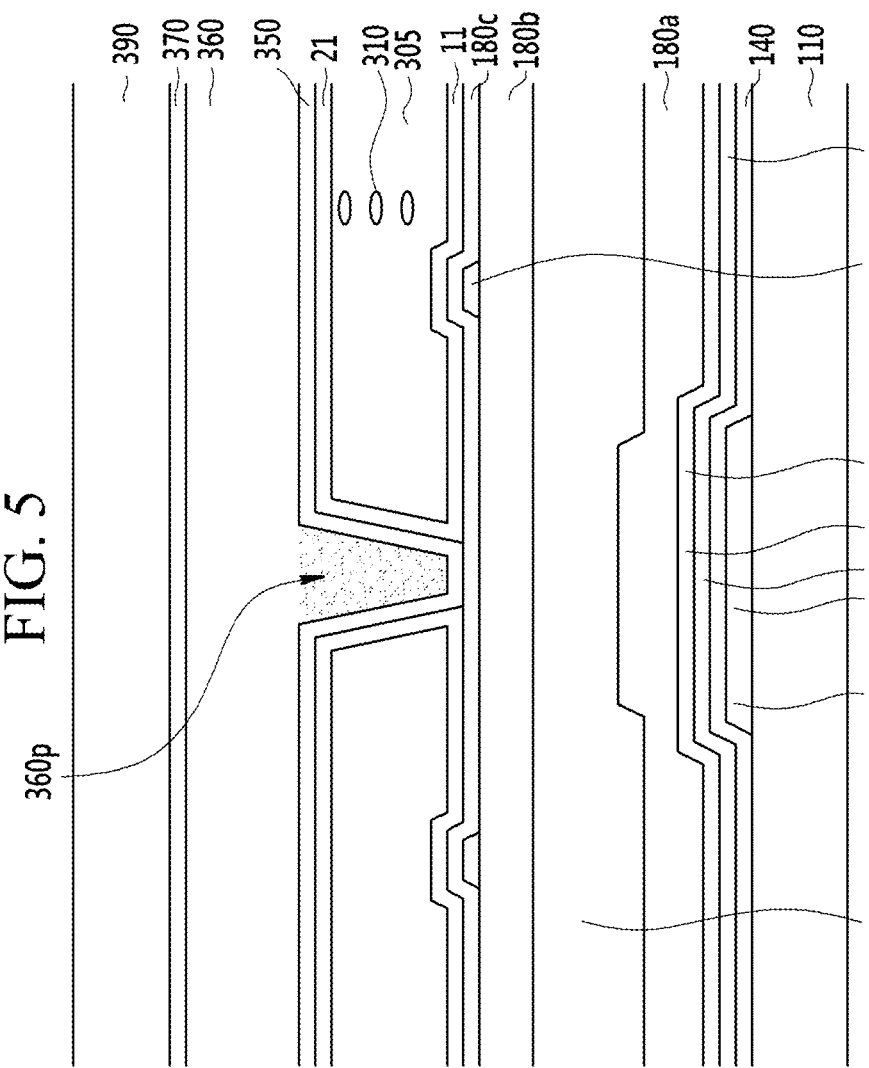
FIG. 5 is a cross-sectional view taken along a line V-V of FIG. 1.
Figure 6:
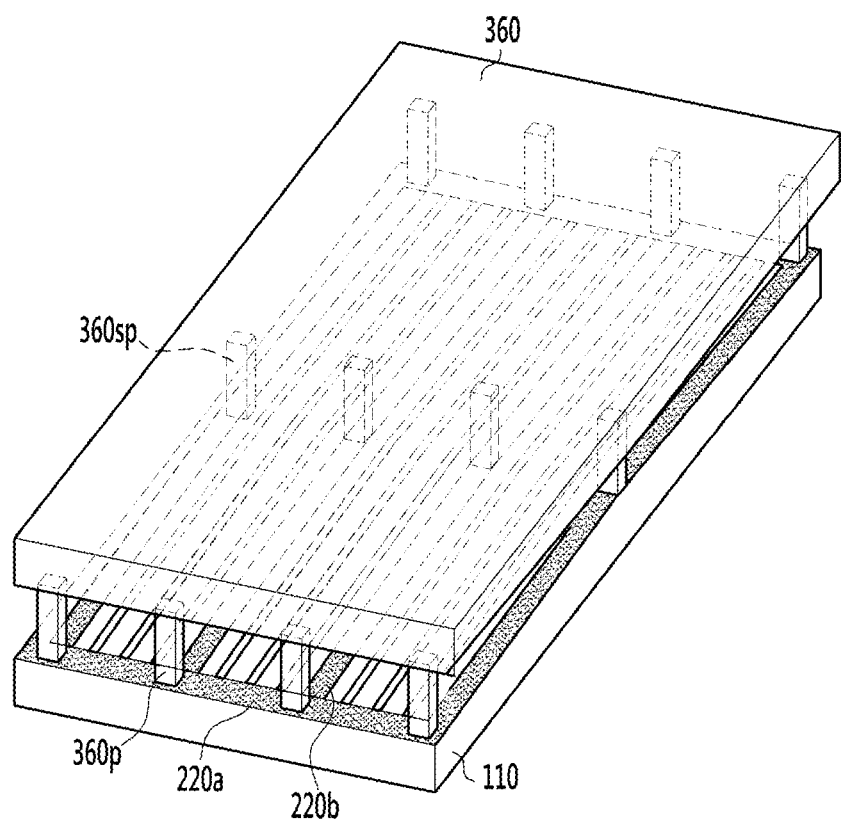
FIG. 6 is a schematic perspective view of an exemplary embodiment shown in FIG. 1 to FIG. 5.

FIG. 1 is a top plan view of a liquid crystal display according to an exemplary embodiment. FIG. 2 is a cross-sectional view taken along a line II-II of FIG. 1. FIG. 3 is a cross-sectional view taken along a line III-III of FIG. 1. FIG. 4 is a cross-sectional view taken along a line IV-IV of FIG. 1. FIG. 5 is a cross-sectional view taken along a line V-V of FIG. 1. FIG. 6 is a schematic perspective view of an exemplary embodiment shown in FIG. 1 to FIG. 5.

FIG. 1 shows a portion of a 3×3 pixel positioned among more pixels, and this pixel portion may be repeatedly arranged upward, downward, leftward, and rightward in the liquid crystal display according to an exemplary embodiment.

Referring to FIG. 1 to FIG. 3, a gate line 121 is formed on a substrate 110 made of transparent glass, plastic, or polymer. The gate line 121 includes a gate electrode 124 and an end portion (not shown) having a wide area for connection to other layers or an external driving circuit. The gate line 121 may be made of a material such as an aluminum-based metal of aluminum (Al) or aluminum alloys, a silver-based metal of silver (Ag) or silver alloys, a copper-based metal copper (Cu) or copper alloys, a molybdenum-based metal of molybdenum (Mo) or molybdenum alloys, chromium (Cr), tantalum (Ta), and titanium (Ti). However, the gate line 121 may be made of a multilayer structure including at least two conductive layers having different physical properties. Although not shown, a storage electrode line applied with a predetermined voltage such as a common voltage Vcom may be disposed on the substrate 110.

A gate insulating layer 140 made of a material such as a silicon nitride ($SiN_x$) or a silicon oxide ($SiO_x$) is formed on the gate line 121. The gate insulating layer 140 may have a multilayer structure including at least two conductive layers having different physical properties. A semiconductor layer 151 provided at a lower portion of a data line 171, and a semiconductor layer 154 disposed at a lower portion of a source/drain electrode and at a channel portion of a thin film transistor Q, are formed on the gate insulating layer 140. The semiconductor layer 154 may be made of amorphous silicon or polysilicon, or an oxide semiconductor.

A plurality of ohmic contacts may be formed on each of the semiconductor layers 151 and 154, and between a data line 171 and source/drain electrodes 173/175, but this is omitted in the drawings.

Data conductors 171, 173, and 175 including the source electrode 173, the data line 171 connected with the source electrode 173, and the drain electrode 175 are formed on each of the semiconductor layers 151 and 154 and the gate insulating layer 140. The data line 171 includes a wide end portion (not illustrated) for connection with another layer or an external driving circuit. The data line 171 transfers a data signal, and extends mainly in a vertical direction to cross the gate line 121.

The source electrode 173 is a part of the data line 171, and is disposed on the same line as the data line 171. The drain electrode 175 is formed to extend in parallel with the source electrode 173. Accordingly, the drain electrode 175 is parallel with a part of the data line 171. The structure of the source electrode 173 and the drain electrode 175 may be changed.

The gate electrode 124, the source electrode 173, and the drain electrode 175 form one thin film transistor Q together with the semiconductor 154, and a channel of the thin film transistor is disposed in the semiconductor 154 between the source electrode 173 and the drain electrode 175.

The data line 171 and the drain electrode 175 may be made of a refractory metal such as molybdenum, chromium, tantalum, and titanium, or an alloy thereof, and may have a multilayer structure including a refractory metal layer (not illustrated) and a low resistance conductive layer (not illustrated). An example of the multilayer structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer.

In the present exemplary embodiment, the data line 171 may have a bent shape in order to obtain maximum transmittance of the liquid crystal display as shown in FIG. 1. The bent portion may be at the middle region of the pixel region to form a V shape.

A first protection layer 180a is formed on the data conductors 171, 173, and 175 and the exposed semiconductor layer 154. The first protection layer 180a may include the inorganic insulator such as a silicon nitride (SiNx), a silicon oxide (SiOx), or an organic insulator.

A color filter 230 and a light blocking member including a transverse light blocking member 220a and a longitudinal light blocking member 220b are formed on the first protection layer 180a.

The light blocking member is formed in a lattice structure having an opening corresponding to the region for displaying an image, and is made of a material through which light is not transmitted. The color filter 230 is formed in the opening of the light blocking member 220. The transverse light blocking member 220a may be formed along the direction parallel to the gate line 121, and the longitudinal light blocking member 220b may be formed along the direction parallel to the data line 171.

Each color filter 230 may display one of primary colors such as three primary colors of red, green, and blue. However, it is not limited to three primary colors such as red, green, and blue, and may display one of cyan, magenta, yellow, and white-based colors. The color filter 230 may be formed of materials displaying different colors for each adjacent pixel.

A second protection layer 180b covering the color filter 230 and the light blocking member is formed thereon. The second protection layer 180b may include the inorganic insulating material, such as a silicon nitride (SiNx) and a silicon oxide (SiOx), or the organic insulating material. Contrary to the illustration in the cross-sectional view of FIG. 2, in a case where a step is generated due to a difference in thickness between the color filter 230 and the light blocking members 220a and 220b, the second protection layer 180b includes an organic insulating material, so that it is possible to decrease or remove the step.

The color filter 230, the light blocking member 220a, and the first and second protection layers 180a and 180b have a contact hole 185 exposing the drain electrode 175.

A common electrode 270 is disposed on the second protection layer 180b. The common electrode 270 has a planar shape, may be formed on the entire first substrate 110 as a plate, and may have an opening 138 formed in the region corresponding to the periphery of the drain electrode 175. That is, the common electrode 270 may be planar with a plate shape.

Common electrodes 270 disposed on adjacent pixels are connected to each other to receive a common voltage of a predetermined level supplied from outside of the display area.

An interlayer insulating layer 180c is formed on the common electrode 270. The interlayer insulating layer 180c may be formed of the organic insulating material or the inorganic insulating material.

A pixel electrode 191 is disposed on the interlayer insulating layer 180c. The pixel electrode 191 may be formed of a transparent conductive material such as ITO or IZO. The pixel electrode 191 includes a plurality of cutouts 91 and a plurality of branch electrodes 192 disposed between the adjacent cutouts.

The first protection layer 180a, the second protection layer 180b, and the interlayer insulating layer 180c have a contact hole 185 exposing the drain electrode 175. The pixel electrode 191 is physically and electrically connected to the drain electrode 175 through the first contact hole 185 to receive a voltage from the drain electrode 175.

The common electrode 270 is a first field generating electrode or a first electrode, and the pixel electrode 191 is a second field generating electrode or a second electrode. The pixel electrode 191 and the common electrode 270 may form a horizontal electric field. The pixel electrode 191 and the common electrode 270 as field generating electrodes generate an electric field such that liquid crystal molecules 310 disposed thereon are rotated in a direction parallel to the direction of the electric field. As such, according to the determined rotation direction of the liquid crystal molecules, the polarization of light passing through the liquid crystal layer is changed.

According to the liquid crystal display of the shown exemplary embodiment, the common electrode 270 has the planar shape and the pixel electrode 191 has a plurality of branch electrodes. However, according to a liquid crystal display of another exemplary embodiment, the pixel electrode 191 may have a planar shape and the common electrode 270 may have a plurality of branch electrodes.

The present concept is applied to all cases in which two field generating electrodes overlap via the insulating layer on the substrate 110, the first field generating electrode under the insulating layer has the plane shape, and the second field generating electrode on the insulating layer has a plurality of branch electrodes.

The common electrode 270 and the pixel electrode 191 may be made of the transparent conductive material such as ITO or IZO.

A lower alignment layer 11 is formed on the pixel electrode 191. The lower alignment layer 11 as a liquid crystal alignment layer made of a material such as polyamic acid, polysiloxane, polyimide, or the like, may include at least one of generally used materials. Also, the lower alignment layer 11 may be a photo-alignment material.

An upper alignment layer 21 is disposed at a portion facing the lower alignment layer 11, and a microcavity 305 is formed between the lower alignment layer 11 and the upper alignment layer 21. A liquid crystal material including liquid crystal molecules 310 is injected in a plurality of microcavities 305.

The plurality of microcavities 305 may be defined by a space corresponding to a plane region enclosed by the gate line 121 and the data line 171. A plurality of microcavities 305 may respectively correspond to the pixel area. The pixel area may be a minimum unit representing contrast. In the present exemplary embodiment, the alignment material forming the alignments layers 11 and 21 and a liquid crystal material including the liquid crystal molecules 310 may be injected into each microcavity 305 by using a capillary force before forming a liquid crystal injection hole formation region 307FP by a capping layer 390.

A lower insulating layer 350 is disposed on the upper alignment layer 21. The lower insulating layer 350 may be formed of silicon nitride (SiNx) or a silicon oxide (SiOx).

A roof layer 360 is disposed on the lower insulating layer 350. The roof layer 360 according to an exemplary embodiment, as shown in FIG. 1 to FIG. 5, may cover most of the pixel area and may form an opening apt in the liquid crystal injection hole formation region 307FP. The roof layer 360 may include a photoresist or other organic materials.

In the present exemplary embodiment, the roof layer 360 is supported by a plurality of columns 360p. The plurality of columns 360p may include the same material as the roof layer 360. The roof layer 360 protrudes downward to form the columns 360p, and the plurality of columns 360p may be extensions of the roof layer 360.

In the present exemplary embodiment, the plurality of columns 360p may be arranged to overlap the gate line 121. In the present exemplary embodiment, the plurality of columns 360p may be disposed over where the gate line 121 and the data line 171 cross each other.

To increase the strength of the liquid crystal display by supporting the roof layer 360, the liquid crystal display according to the present exemplary embodiment may include an assistance column 360sp. The column 360p and the assistance column 360sp include the same material. However, unlike the plurality of columns 360p overlapping the gate line 121, the assistance column 360sp, as shown in FIG. 4, may be arranged overlapping the data line 171 between two neighboring gate lines. The assistance column 360sp may include a first assistance column and a second assistance column disposed to respectively overlap the neighboring first data line and second data line.

In the present exemplary embodiment, the assistance column 360sp may be disposed at the bent portion of the data line 171.

In a conventional case, a partition that is wider than the data line 171 is formed along the data line 171 at the position overlapping most of the data line 171, undesirably decreasing the aperture ratio. In the present exemplary embodiment, the plurality of columns 360 supporting the roof layer 360 are formed along the gate line 121 and the assistance column 360sp only partially overlaps the data line 171, thereby minimizing the reduction of the aperture ratio.

An upper insulating layer 370 is disposed on the roof layer 360. The upper insulating layer 370 may contact the upper surface of the roof layer 360. The upper insulating layer 370 may be formed of silicon nitride (SiNx) or silicon oxide (SiOx).

The liquid crystal injection hole formation region 307FP that is not covered by the roof layer 360 is disposed along the portion overlapping the gate line 121, and the microcavity 305 may be disposed to be separated in the vertical direction by the liquid crystal injection hole formation region 307FP. In the present exemplary embodiment, as shown in FIG. 5, the roof layer 360 may be connected vertically along the portion where the column 360p is formed.

The capping layer 390 is disposed on the upper insulating layer 370. In the present exemplary embodiment, the capping layer 390 covers a liquid crystal injection hole 307 corresponding to an inlet of the microcavity 305 exposed by the liquid crystal injection hole formation region 307FP while filling the liquid crystal injection hole formation region 307FP. The liquid crystal injection hole 307 is disposed along the gate line 121, and is a portion in which the alignment material and the liquid crystal material are injected in the manufacturing process. The capping layer 390 includes an organic material or an inorganic material.

Here, the liquid crystal material is removed from the liquid crystal injection hole formation region 307FP. However, the liquid crystal material that is injected in the plurality of microcavities 305 and then remains may stay at the liquid crystal injection hole formation region 307FP.

Referring to FIG. 6, in the present exemplary embodiment, the plurality of columns 360p may be disposed along the transverse light blocking member 220a, and the plurality of assistance columns 360sp may be disposed while overlapping the data line between the first gate line and the second gate line. The plurality of columns 360p and the plurality of assistance columns 360sp may be at least four in one pixel area to prevent deformation of the roof layer 360, thereby maintaining the strength of the liquid crystal display.

In the present exemplary embodiment, the common electrode 270 is formed under the microcavity 305 in a description of the liquid crystal driving according to a coplanar electrode (CE) mode. However, the present exemplary embodiment may also be applied to a liquid crystal display of a liquid crystal driving type according to a vertical electric field mode in the structure in which the common electrode 270 is formed above the microcavity 305.

Although not shown, a polarizer may be formed below the substrate 110 and/or above the capping layer 390.

Figure 7:
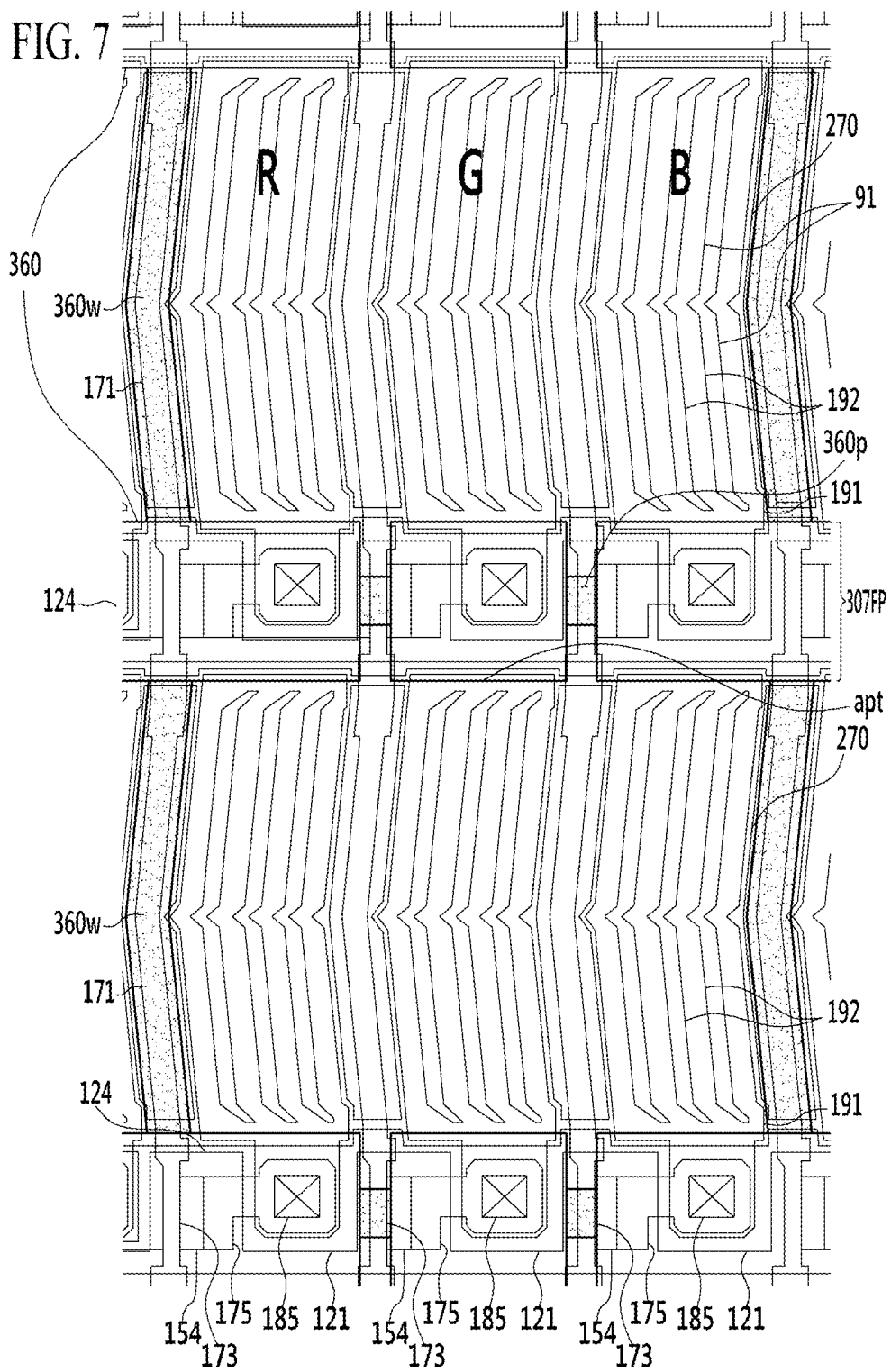
FIG. 7 is a top plan view of a liquid crystal display according to an exemplary embodiment of the present inventive concept.
Figure 8:
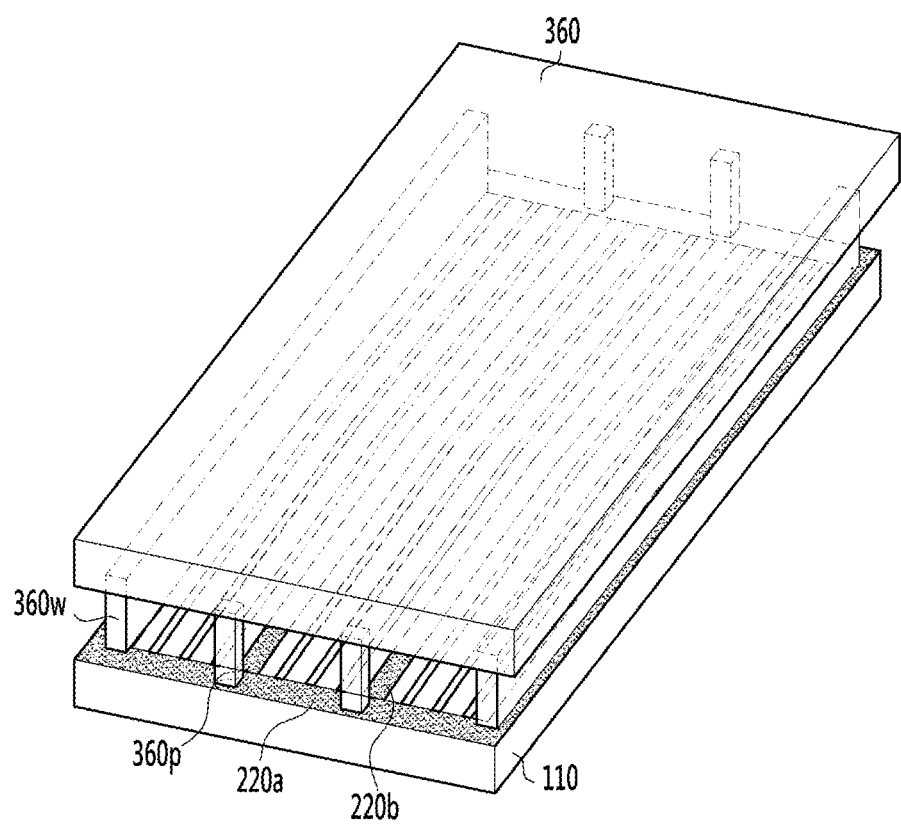
FIG. 8 is a schematic perspective view of an exemplary embodiment shown in FIG. 7.

FIG. 7 is a top plan view of a liquid crystal display according to an exemplary embodiment of the inventive concept. FIG. 8 is a schematic perspective view of an exemplary embodiment shown in FIG. 7.

The exemplary embodiment depicted in FIG. 7 and FIG. 8 is similar to the exemplary embodiment depicted in FIG.

1 to FIG. 6, except for the roof layer 360 and the structure supporting the roof layer 360. Hereafter, differences will be described.

Referring to FIG. 7 and FIG. 8, in the present exemplary embodiment, the structure supporting the roof layer 360 includes a plurality of columns 360p and a partition 360w. In the present exemplary embodiment, the plurality of columns 360p are disposed along the gate line 121 like the above-described exemplary embodiment, however a total of four columns 360p are formed in the unit pixel including a first pixel area corresponding to a red pixel region R, a second pixel area corresponding to a green pixel region G, and a third pixel area corresponding to a blue pixel region B.

The unit pixel may be repeatedly arranged vertically and horizontally. The unit pixel includes a first unit pixel and a second unit pixel neighboring in the horizontal direction, the partition 360w is disposed between the first unit pixel and the second unit pixel, and the partition 360w extends generally in the direction of the data line 171.

The liquid crystal display according to the present exemplary embodiment does not always include the assistance column 360sp. For example, where the partition 360w is formed between the unit pixels, the partition 360w may be sufficient to maintain the durability of the liquid crystal display.

General descriptions provided in reference to FIG. 1 to FIG. 5 may apply to the exemplary embodiment of FIG. 7 and FIG. 8 as well as the explicitly-described differences.

Figure 9:
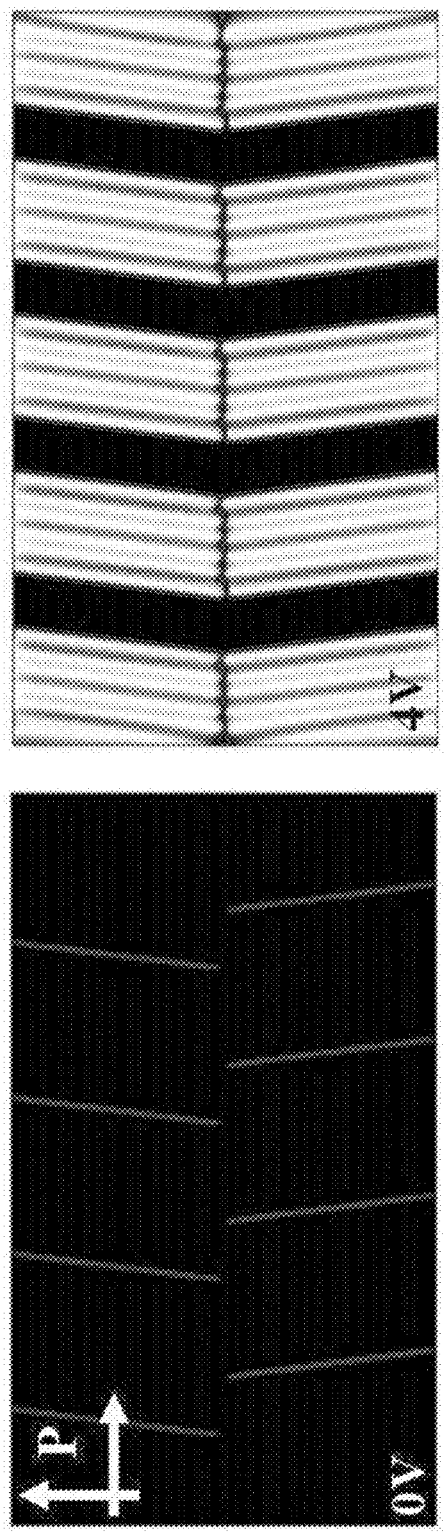
FIG. 9 is a photo showing a light transmission result in a liquid crystal display according to a comparative example in which a partition extends across a sub-unit pixel.
Figure 10:
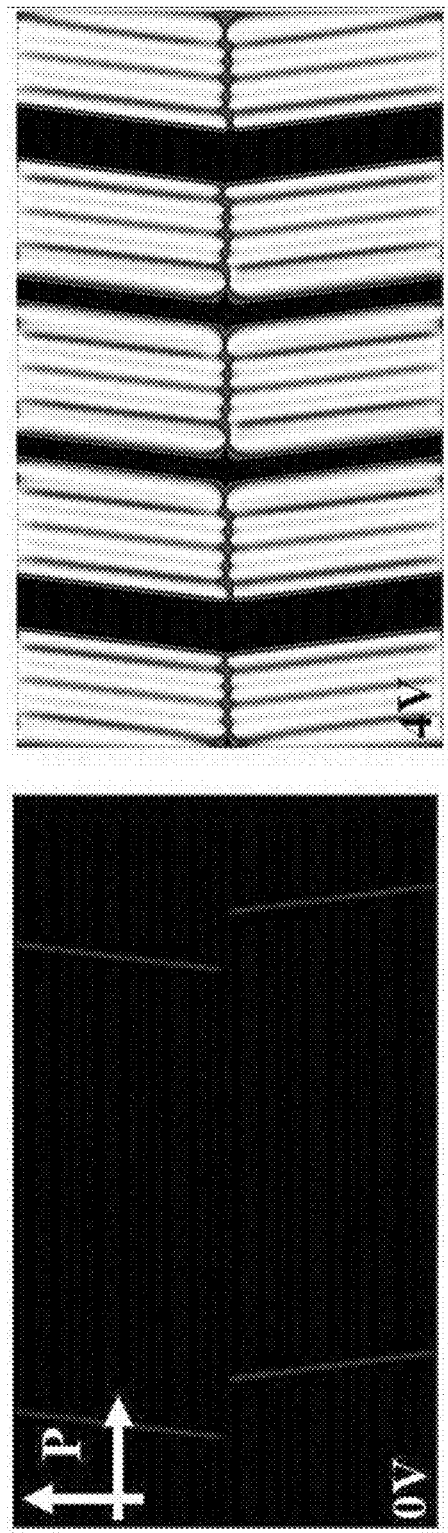
FIG. 10 is a photo showing a light transmission result in a liquid crystal display according to an exemplary embodiment described in FIG. 7 and FIG. 8.
Figure 11:
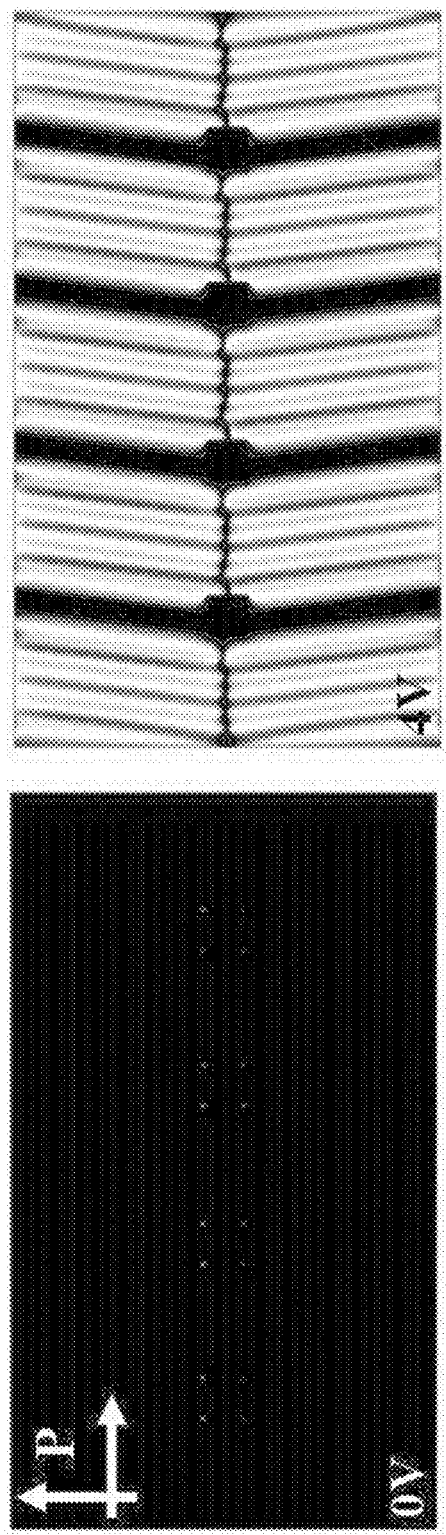
FIG. 11 is a photo showing a light transmission result in a liquid crystal display according to an exemplary embodiment described in FIG. 1 to FIG. 6.

FIG. 9 is a photo showing a light transmission result in a liquid crystal display according to a comparative example in which a partition is elongated for each sub-unit pixel. FIG. 10 is a photo showing a light transmission result in the liquid crystal display according to an exemplary embodiment described in FIG. 7 and FIG. 8. FIG. 11 is a photo showing a light transmission result in a liquid crystal display according to the exemplary embodiment described in FIG. 1 to FIG. 6. In FIG. 9 to FIG. 11, horizontal and vertical direction arrows represent a transmissive axis direction of the polarizers.

In the embodiment of FIG. 9, in which the partition is formed for each sub-pixel to support the roof layer, there is some reduction in the aperture ratio and the entire transmittance is 0.16481. In the embodiment of FIG. 10, in which the partition is formed for each unit pixel, the entire transmittance is 0.18337. In the embodiment of FIG. 11, in which the roof layer is supported by the plurality of columns without the partitions, the entire transmittance is 0.20045.

Figure 12:
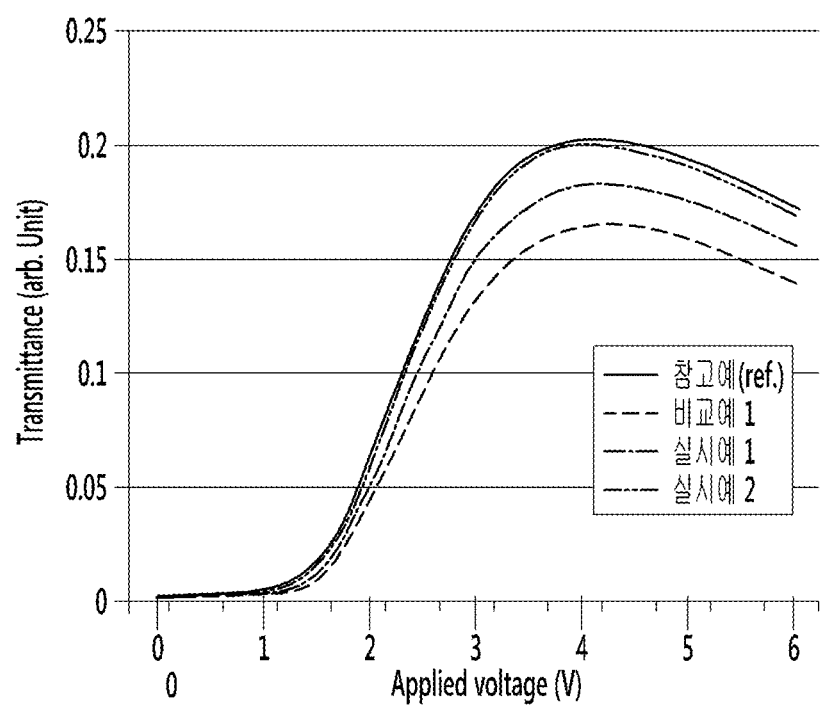
FIG. 12 is a graph showing transmittance according to a driving voltage.

FIG. 12 is a graph showing transmittance according to a driving voltage. In FIG. 12, a reference example (ref., shown by solid line) represents a general liquid crystal display in which the liquid crystal layer is formed between the upper panel and the lower panel and the cell gap is maintained by a spacer. Comparative Example 1 (shown by broken lines) represents the liquid crystal display in which the partition extends for each sub-unit pixel, as in the embodiment of FIG. 9. Exemplary Embodiment 1 (shown by a line including a dot between broken lines) is the liquid crystal display of FIG. 10, and Exemplary Embodiment 2 (shown by a line including two dots between broken lines) represents the liquid crystal display described of FIG. 11.

Referring to FIG. 12, compared with Comparative Example 1 in which a partition is formed for each sub-unit pixel to support the roof layer, the transmittance is improved by 11% and 21% in Exemplary Embodiments 1 and 2, respectively. In the case of the Exemplary Embodiment 2, the transmittance may be close to the transmittance of the general liquid crystal display, as shown by the closeness of the two lines.

Figure 13:
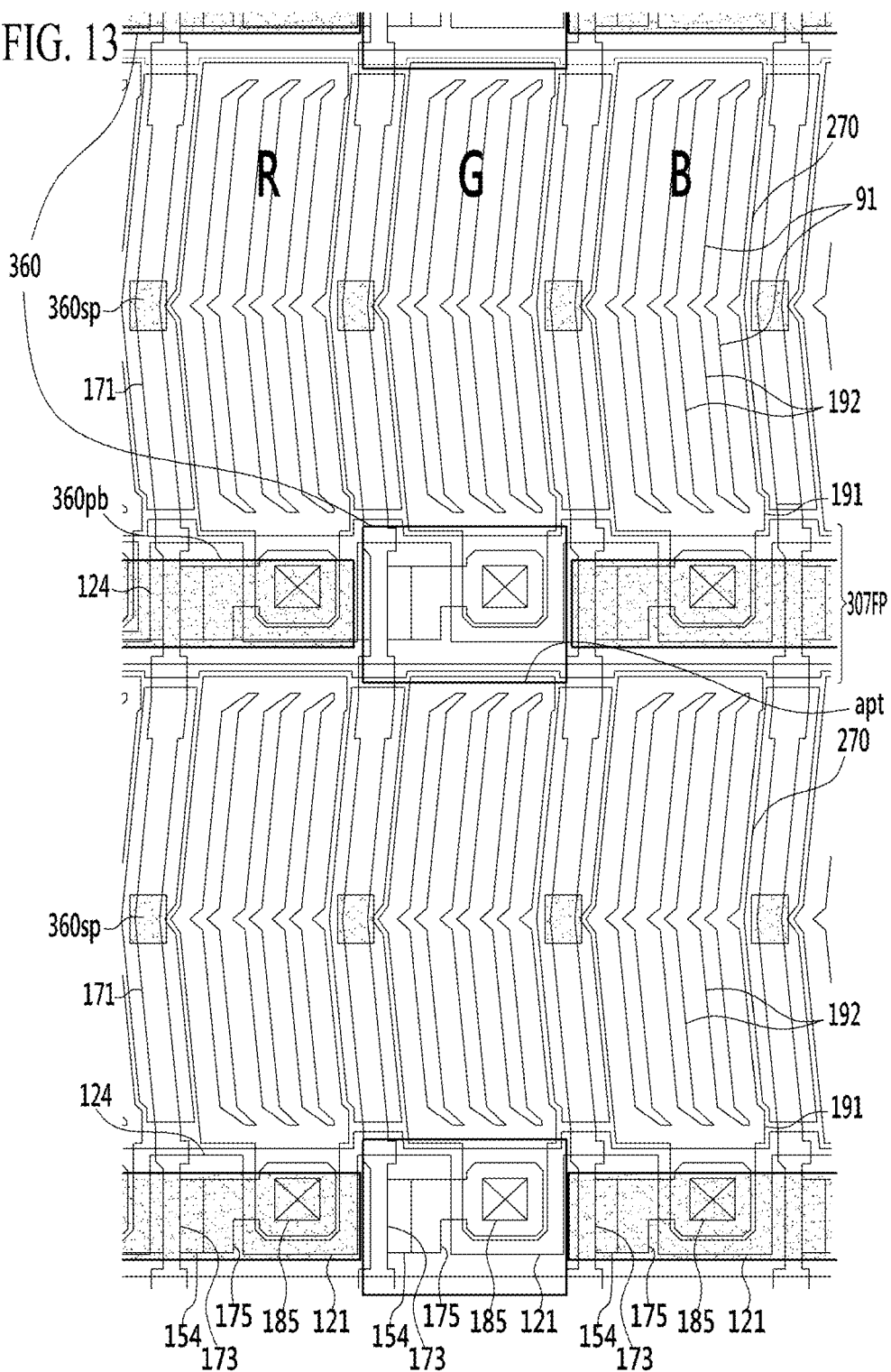
FIG. 13 is a top plan view of a liquid crystal display according to an exemplary embodiment of the present inventive concept.

FIG. 13 is a top plan view of a liquid crystal display according to another exemplary embodiment.

The exemplary embodiment to be described in FIG. 13 is similar to the exemplary embodiment described in reference to FIG. 1 to FIG. 6, except for the roof layer 360 and a structure supporting the roof layer 360. In the interest of clarity, the following description will focus on portions that are different from the embodiment of FIG. 1 to FIG. 6.

Referring to FIG. 13, in the present exemplary embodiment, the roof layer 360 includes one opening apt at one unit pixel, and the structure supporting the roof layer 360 includes a plurality of assistance columns 360sp and a column body 360pb formed along the gate line. The column body 360pb is different from the plurality of columns 360p shown in FIG. 1 in that the column body 360pb are formed linearly along the gate line 121. In the case shown in FIG. 13, the column body 360pb extends continuously between neighboring data lines 171. This configuration may enhance the strength and durability of the liquid crystal display compared with the exemplary embodiment of FIG. 1 to FIG. 6.

The general description of the embodiments of FIG. 1 to FIG. 5 may be applied to the embodiment of FIG. 13, as well as the explicitly-described differences.

Figure 14:
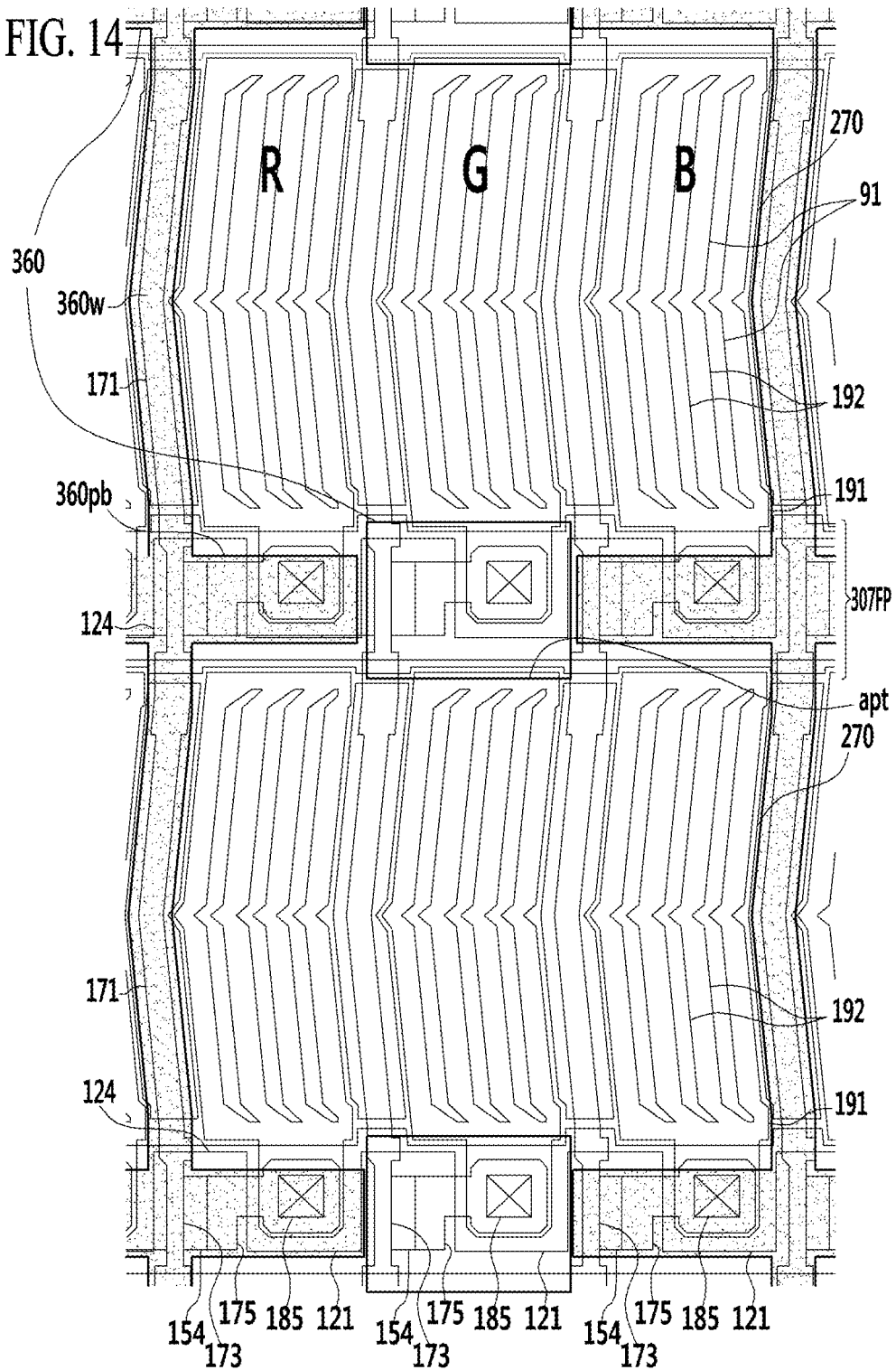
FIG. 14 is a top plan view of a liquid crystal display according to an exemplary embodiment of the present inventive concept.

FIG. 14 is a top plan view of a liquid crystal display according to an exemplary embodiment.

An exemplary embodiment to be described in FIG. 14 is almost the same as the exemplary embodiment described in FIG. 7 and FIG. 8, except for the roof layer 360 and the structure supporting the roof layer 360. A portion having differences will be described.

Referring to FIG. 14, in the present exemplary embodiment, the roof layer 360 includes one opening apt at the unit pixel, and the structure supporting the roof layer 360 includes the partition 360w and the column body 360pb formed along the gate line. In the present exemplary embodiment, the column body 360pb are formed linearly along the gate line 121, sometimes extending continuously between two data lines 171. The partition 360w of this embodiment extends to cover select data lines 171, as shown.

In the present exemplary embodiment, the partition 360w and the column body 360pb may be connected to each other.

The configuration of this embodiment may enhance the strength and durability of the liquid crystal display compared with the exemplary embodiment of FIG. 7 and FIG. 8.

The general description of the embodiments of FIG. 7 and FIG. 8 may apply to the embodiment of FIG. 14, as well as the explicitly-described differences.

Next, an exemplary embodiment for a manufacturing method of the above described liquid crystal display will be described with reference to FIG. 15 to FIG. 37. An exemplary embodiment to be described below may be varied as an exemplary embodiment of the manufacturing method.

FIG. 15 to FIG. 37 are top plan views and cross-sectional views showing a manufacturing method of a liquid crystal display according to an exemplary embodiment of the present inventive concept. FIGS. 16, 21, 24, 25, 29, 30, and 34 sequentially show the cross-sectional views taken along the line II-II of FIG. 1. FIGS. 17, 22, 26, 31, and 35 sequentially show the cross-sectional views taken along the line III-III of FIG. 1. FIGS. 18, 23, 27, 32, and 36 sequentially show the cross-sectional views taken along the line IV-IV of FIG. 1. FIGS. 19, 24, 28, 33, and 37 sequentially show the cross-sectional views taken along the line V-V of FIG. 1.

Figure 15:
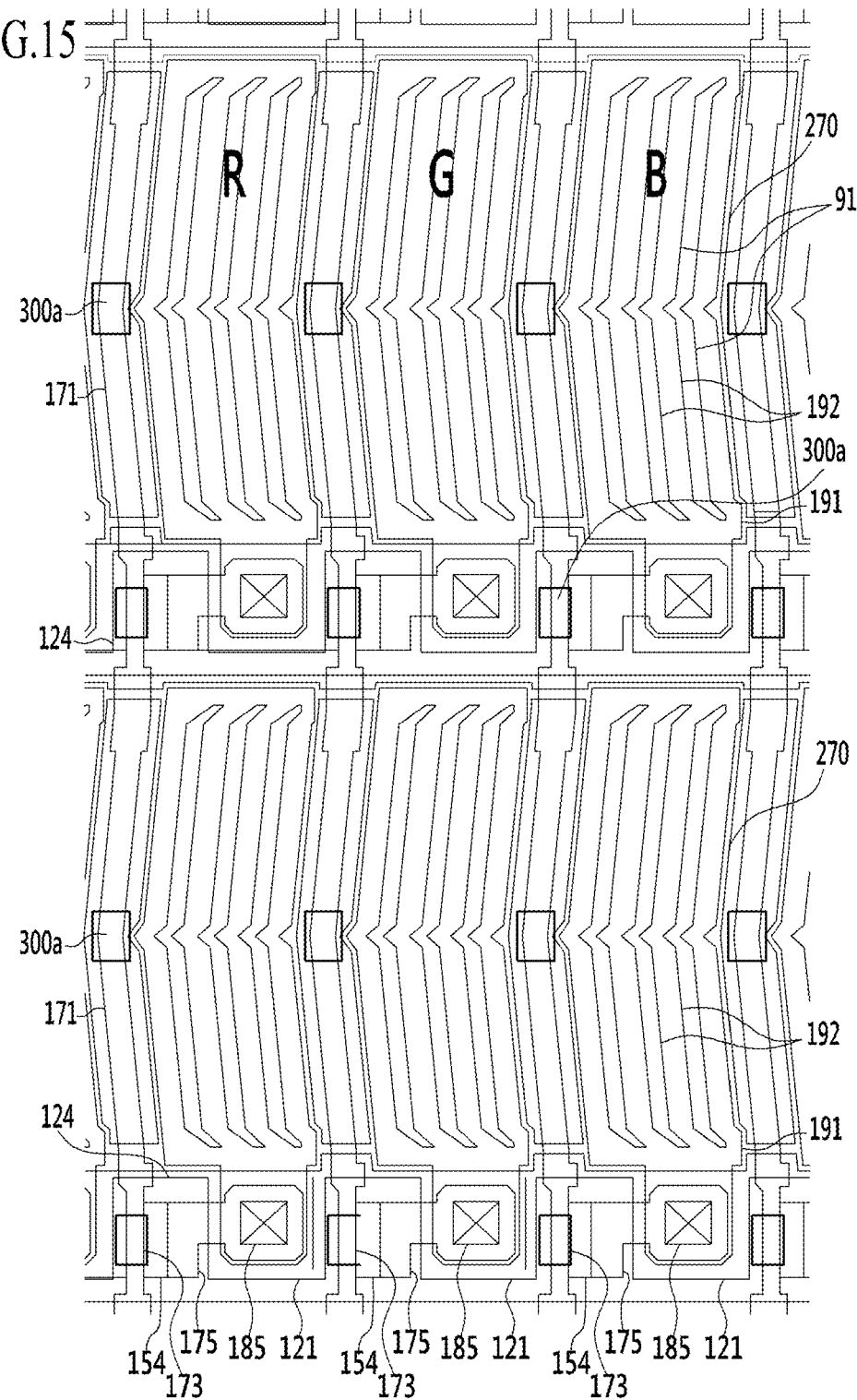
FIG. 15, FIG. 16, FIG. 17, FIG. 18, FIG. 19, FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, FIG. 35, FIG. 36, and FIG. 37 are top plan views and cross-sectional views showing a manufacturing method of a liquid crystal display according to an exemplary embodiment of the present inventive concept.
Figure 16:
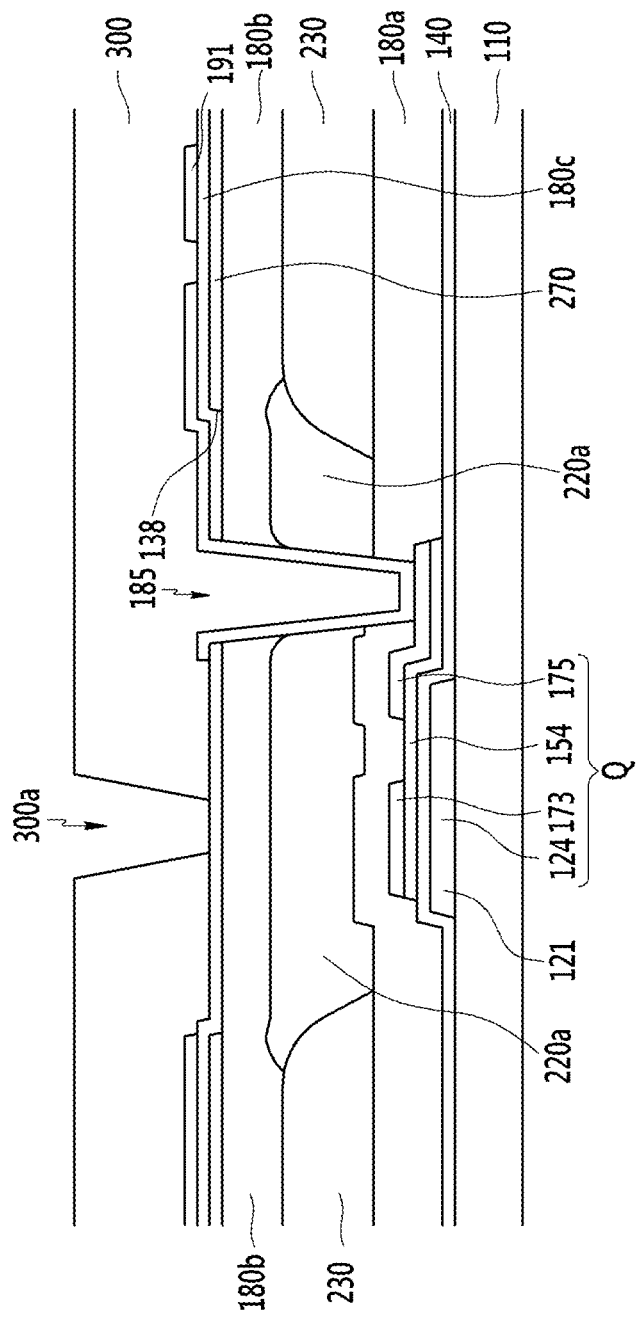
Figure 17:
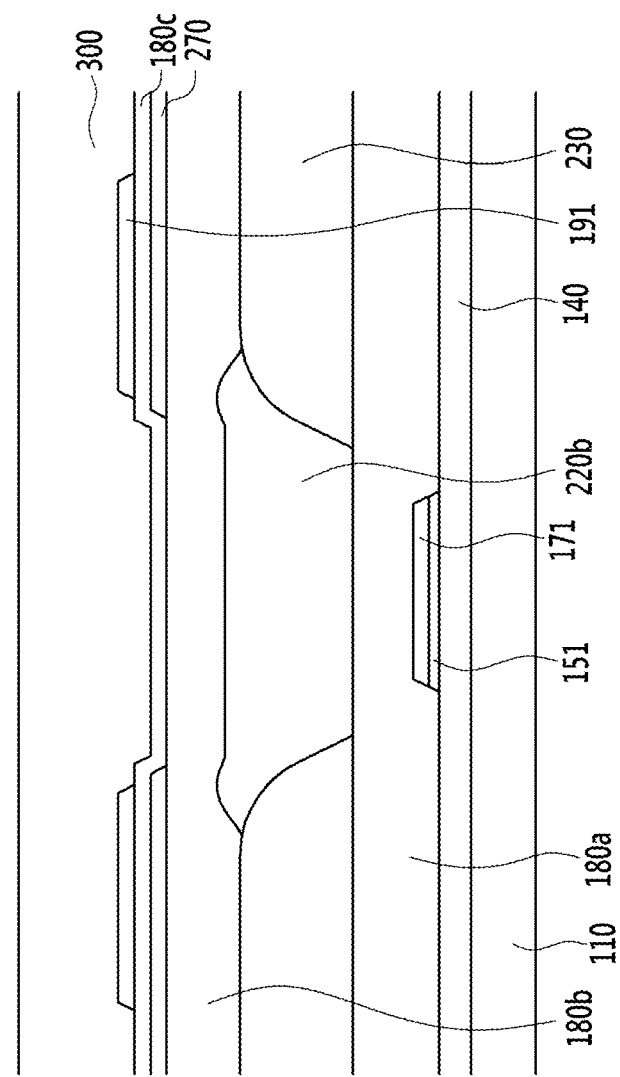
Figure 18:
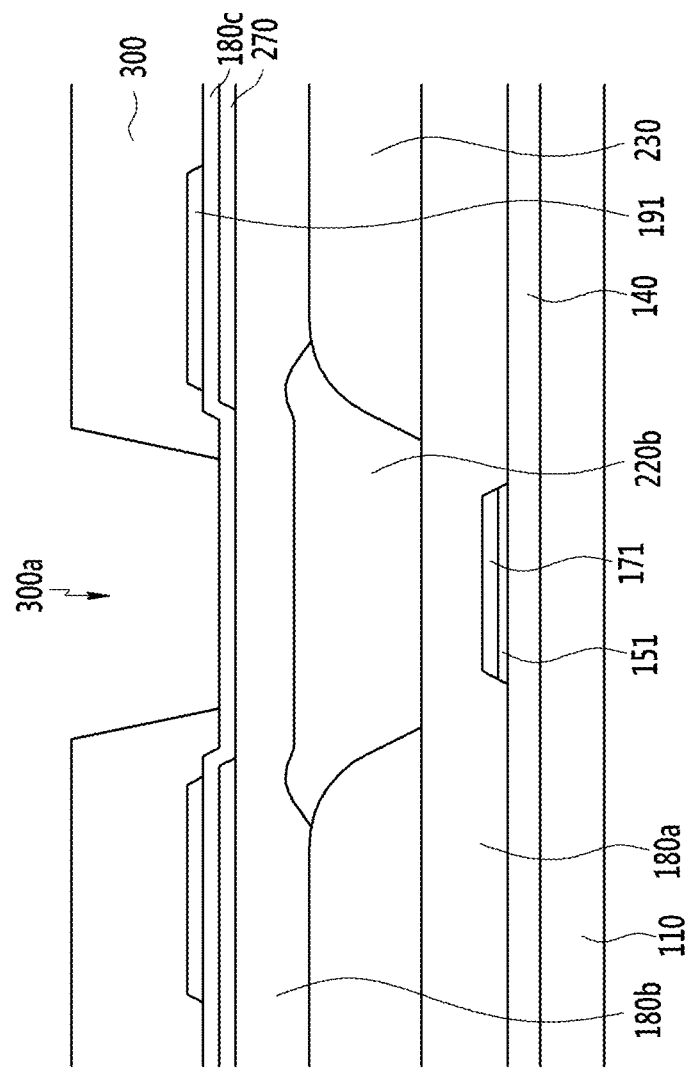
Figure 19:
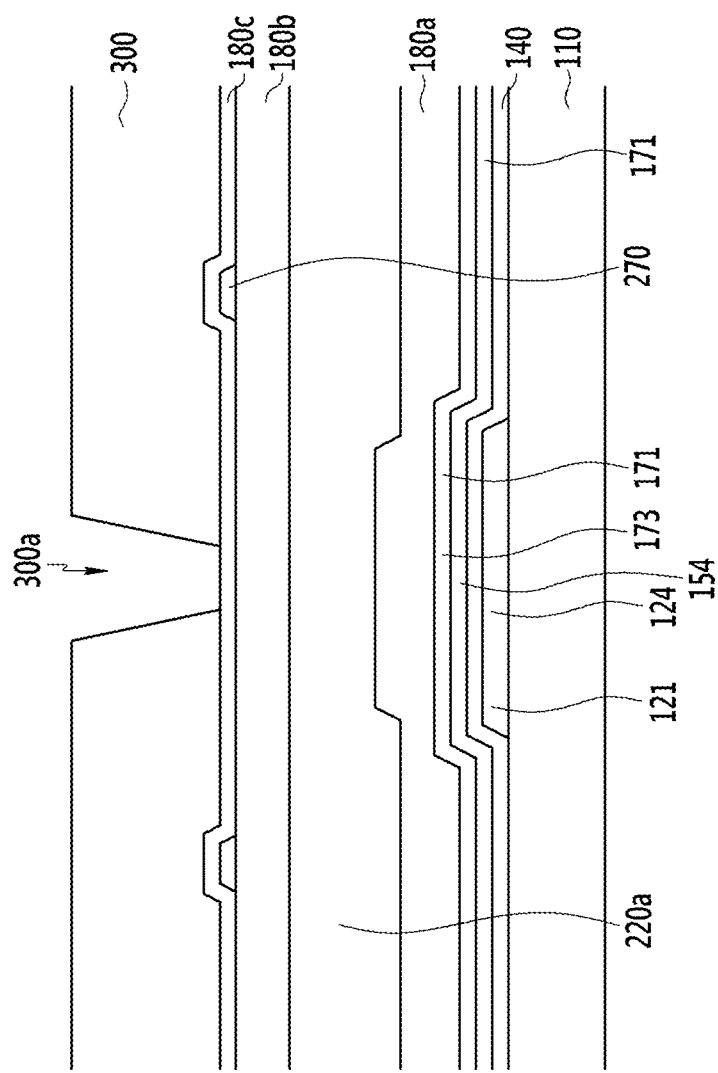
Figure 20:
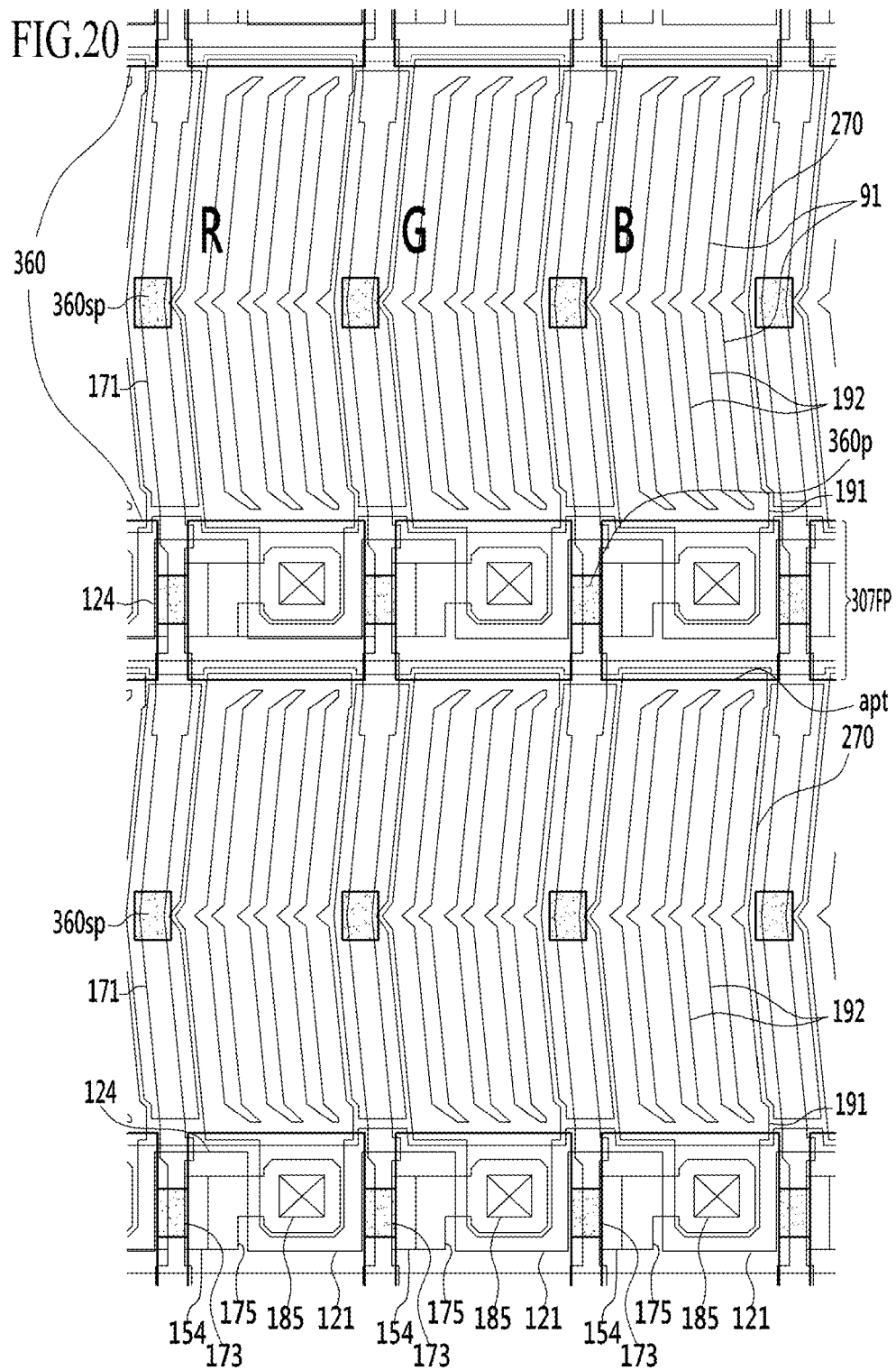

Referring to FIG. 15 to FIG. 19, in order to form a generally known switching element on a substrate 110, the gate line 121 is formed extending in the horizontal direction ("horizontal" being with respect to the orientation of FIG. 15). The gate insulating layer 140 is formed on the gate line 121, the semiconductor layers 151 and 154 are formed on the gate insulating layer 140, and the source electrode 173 and the drain electrode 175 are formed. In this case, the data line 171 connected with the source electrode 173 may be formed to extend in the vertical direction while crossing the gate line 121.

The first protection layer 180a is formed on the data conductor 171, 173, and 175 including the source electrode 173, the drain electrode 175, and the data line 171, and the exposed semiconductor layer 154.

The color filter 230 is formed at the position corresponding to the pixel area on the first protection layer 180a and the light blocking member is formed between the color filters 230. The light blocking member 220 includes the transverse light blocking member 220a formed in the direction parallel to the gate line 121 and the longitudinal light blocking member 220b formed in the direction parallel to the data line 171.

The second protection layer 180b covering the color filter 230 and the light blocking member is formed thereon, and the second protection layer 180b has the contact hole 185 to electrically and physically connect the pixel electrode 191 and the drain electrode 175.

Next, the common electrode 270 of the plane shape is formed on the second protection layer 180b. The common electrode 270 has the opening 138 disposed at the portion overlapping the gate line 121 or the data line 171, however it may be formed to be connected in the adjacent pixels. The interlayer insulating layer 180c is formed on the common electrode 270, and the pixel electrode 191 is formed on the interlayer insulating layer 180c. The interlayer insulating layer 180c is formed to have the contact hole 185 to electrically and physically connect the pixel electrode 191 and the drain electrode 175 along with the first protection layer 180a and the second protection layer 180b.

The pixel electrode 191 includes a plurality of cutouts 91 and a plurality of branch electrodes 192 disposed between the adjacent cutouts 91.

Next, a sacrificial layer 300 is formed on the pixel electrode 191. As shown in FIG. 15, the sacrificial layer 300 covers most of the plurality of pixel areas, and has a plurality of column holes 300a penetrating the sacrificial layer 300 while being spaced apart by a predetermined interval.

Referring to FIG. 20 to FIG. 24, the lower insulating layer 350 and the roof layer 360 are sequentially formed on the sacrificial layer 300. The lower insulating layer 350 and the roof layer 360 may cover the column holes 300a formed at the sacrificial layer 300 while filling the column holes 300a.

Figure 21:
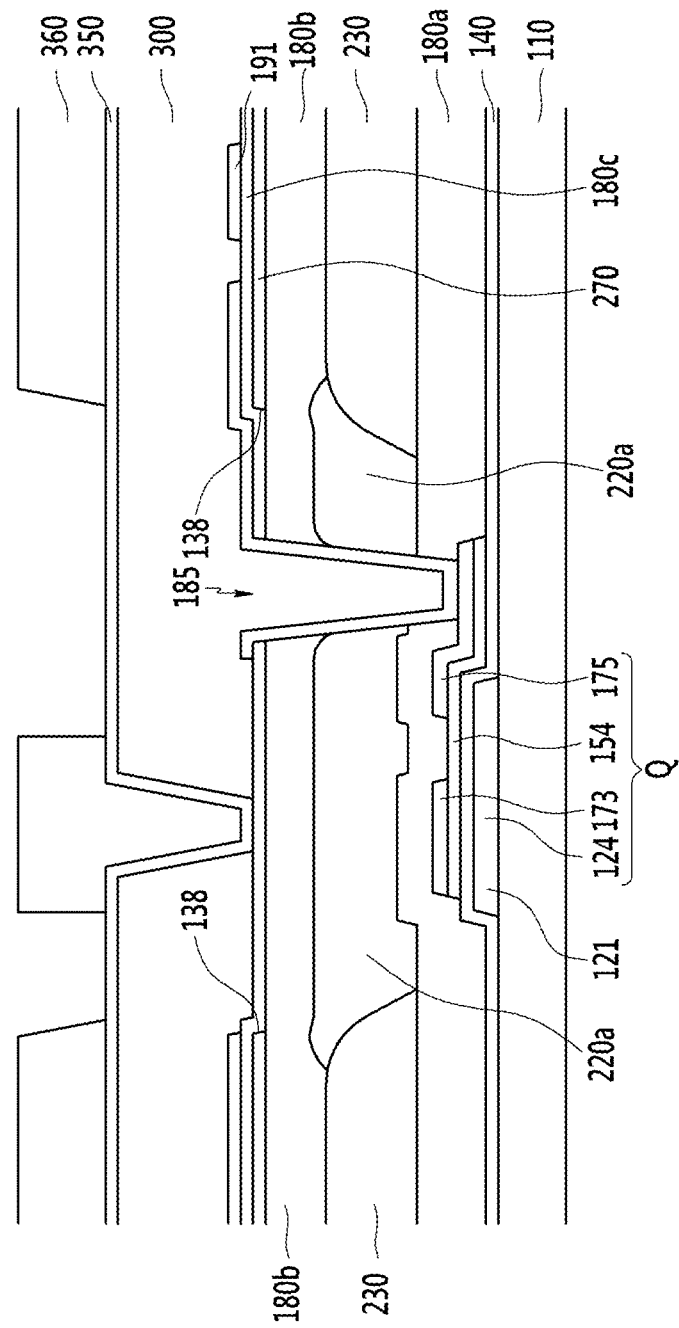
Figure 22:
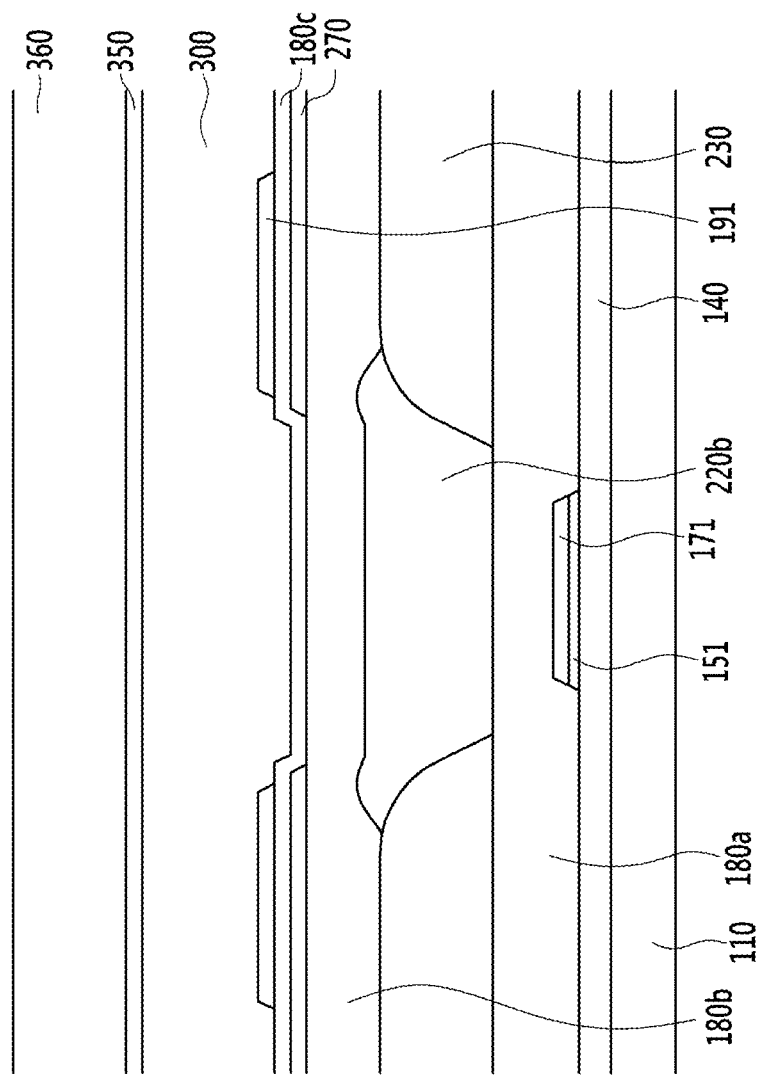
Figure 24:
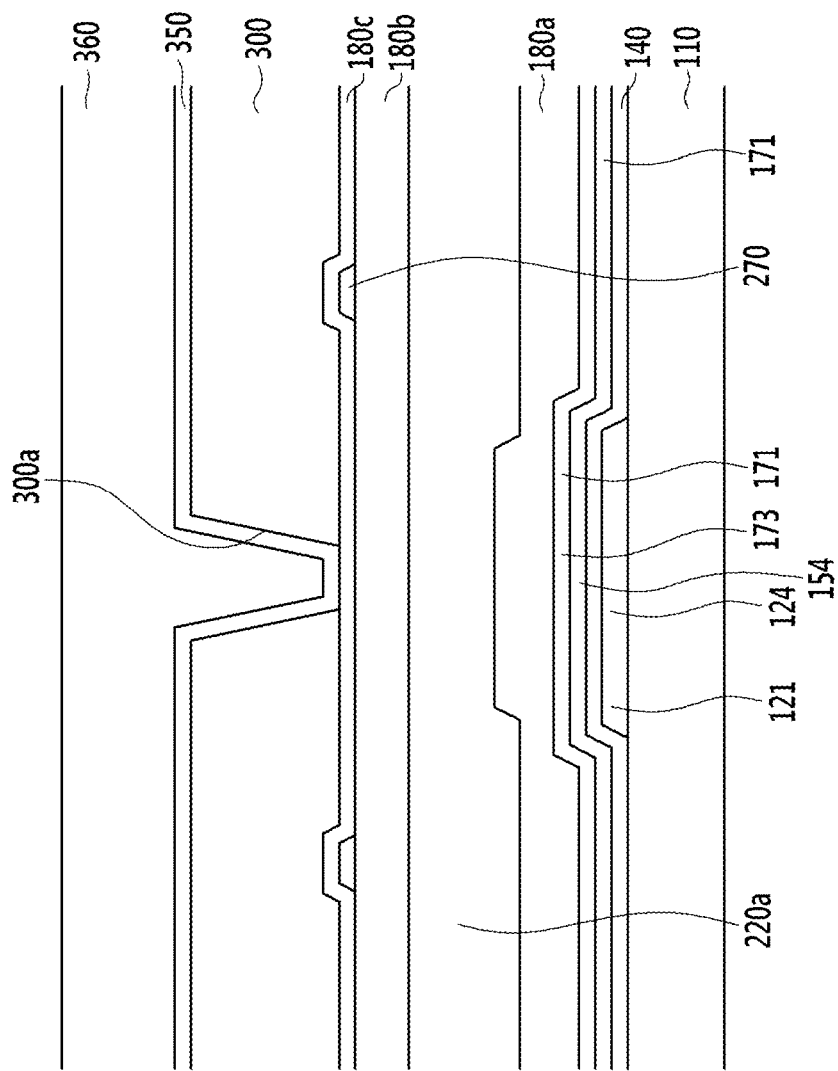
Figure 25:
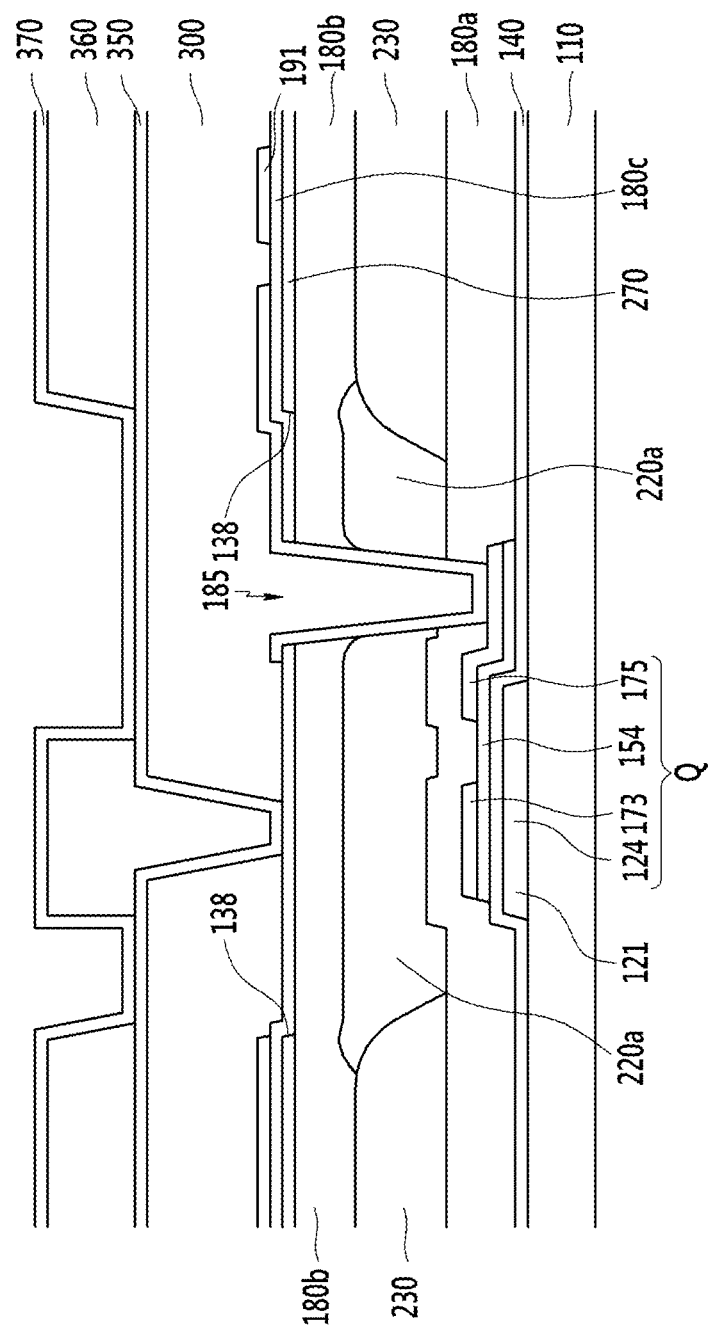
Figure 26:
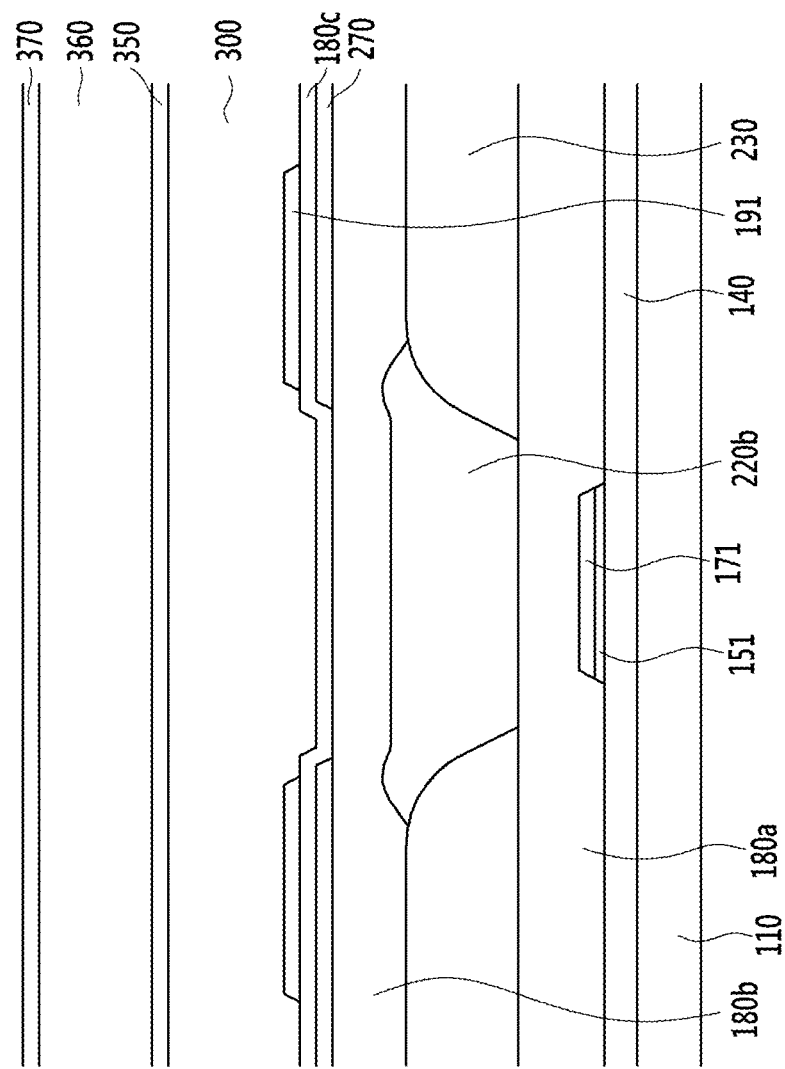
Figure 27:
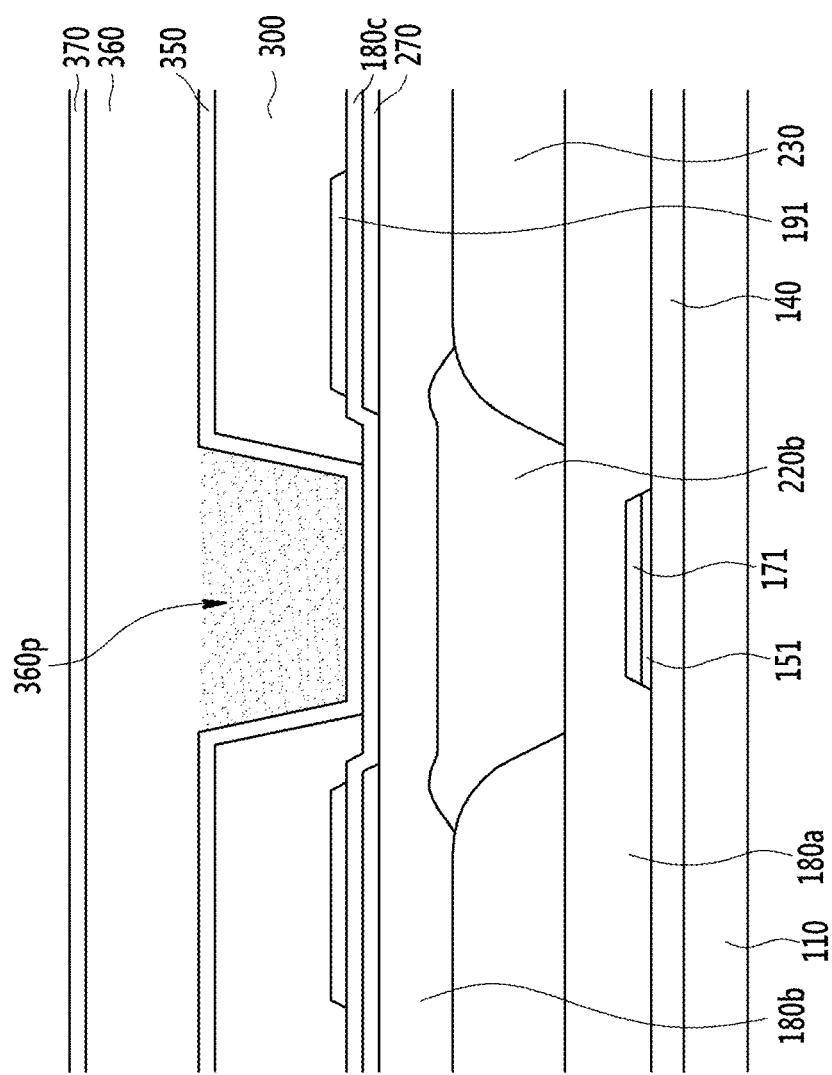
Figure 28:
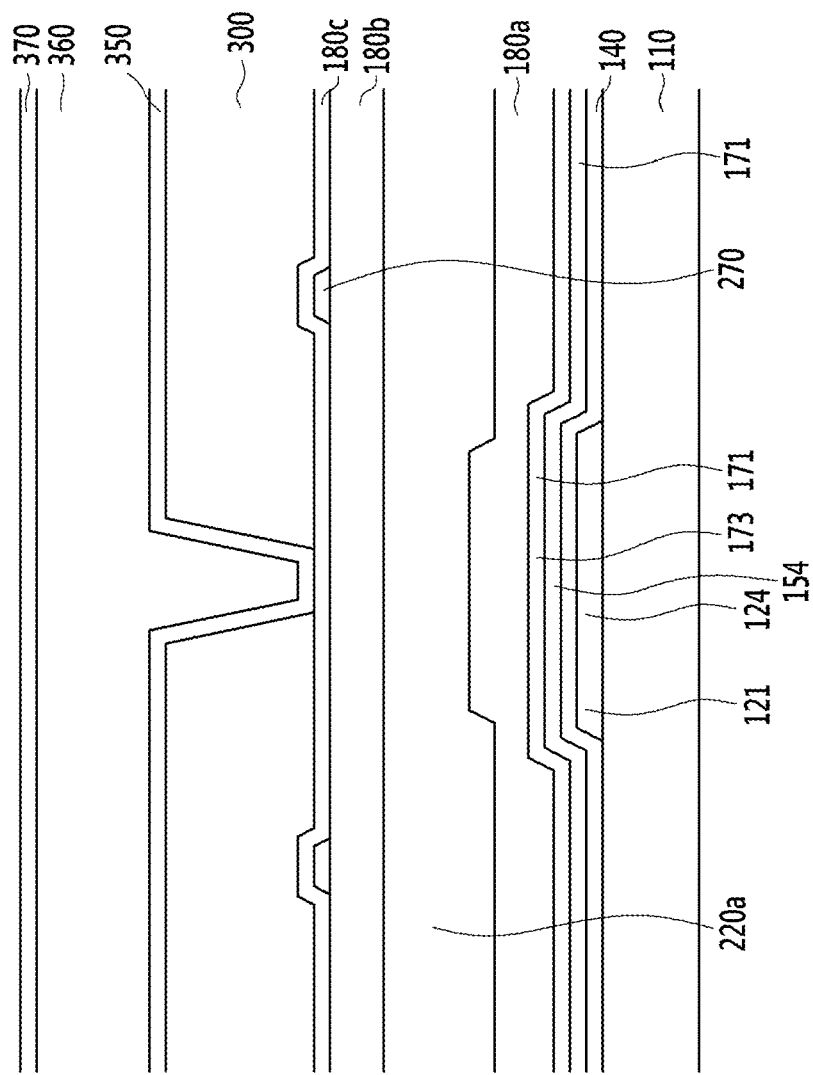

The roof layer 360 may be removed in the region corresponding to the transverse light blocking member 220a disposed between the pixel areas adjacent in the vertical direction by an exposure and development process. However, as shown in FIG. 21 and FIG. 24, the roof layer 360 may be connected vertically along the portion where the column holes 300a are formed.

Figure 23:
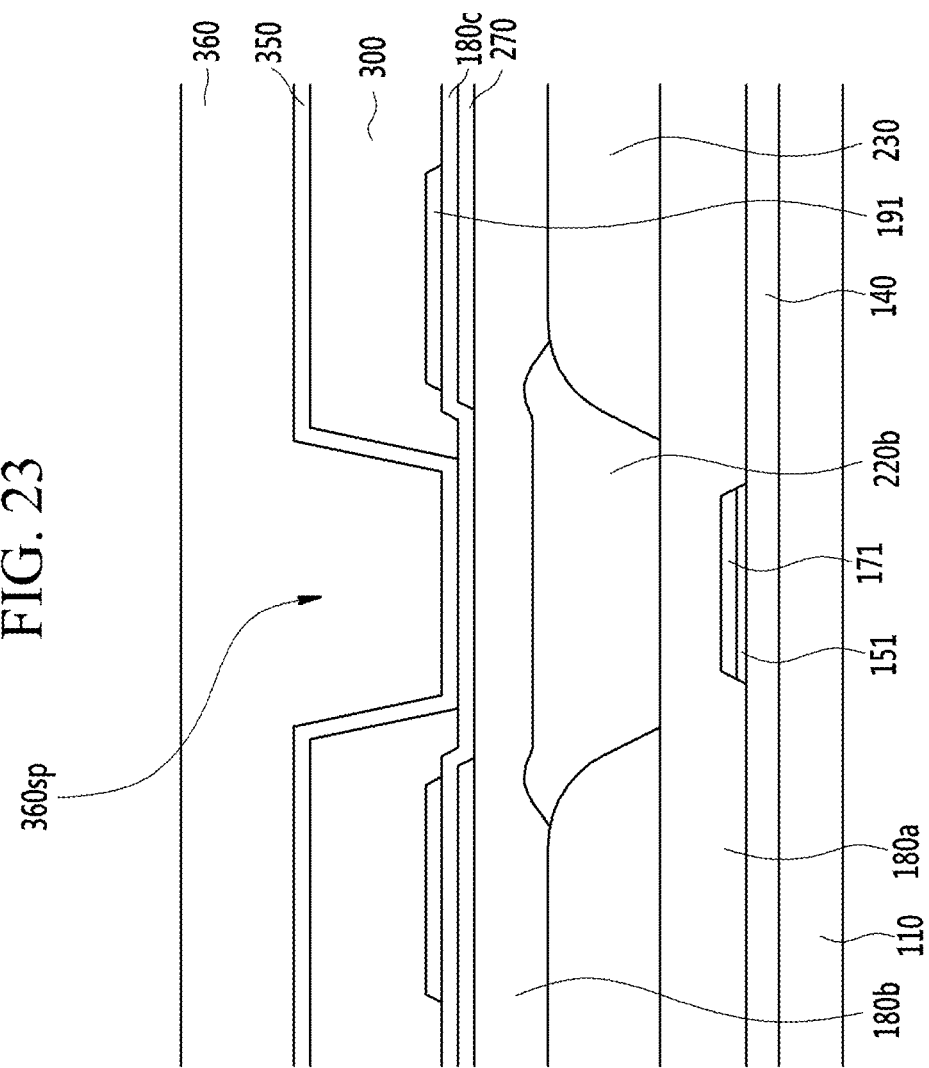

The roof layer 360 exposes the lower insulating layer 350 in the region corresponding to the transverse light blocking member 220a. In this case, as shown in FIG. 23, the assistance column 360sp is formed while filling the column holes 300a corresponding to the longitudinal light blocking member 220b with the lower insulating layer 350 and the roof layer 360.

Referring to FIG. 20 and FIG. 25 to FIG. 28, the upper insulating layer 370 is formed to cover the roof layer 360 and the exposed lower insulating layer 350.

Figure 29:
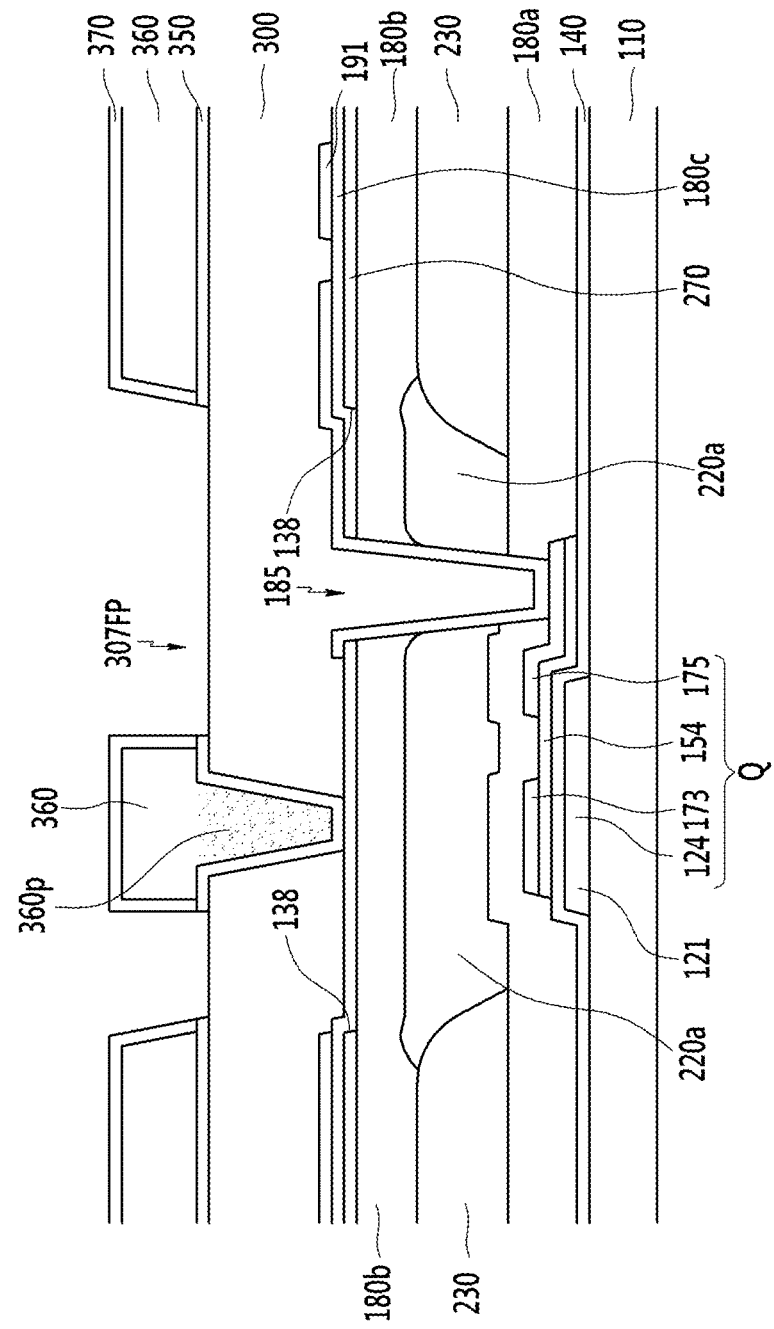
Figure 30:
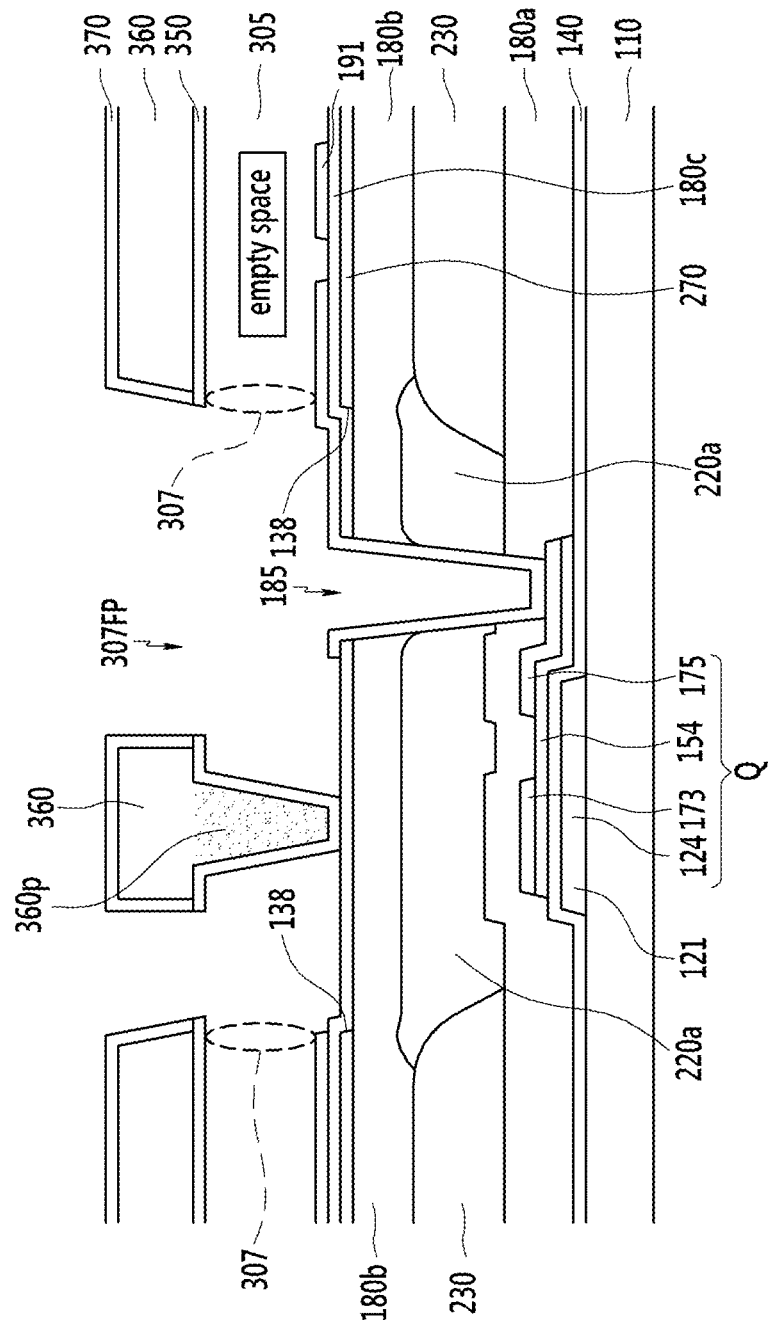
Figure 31:
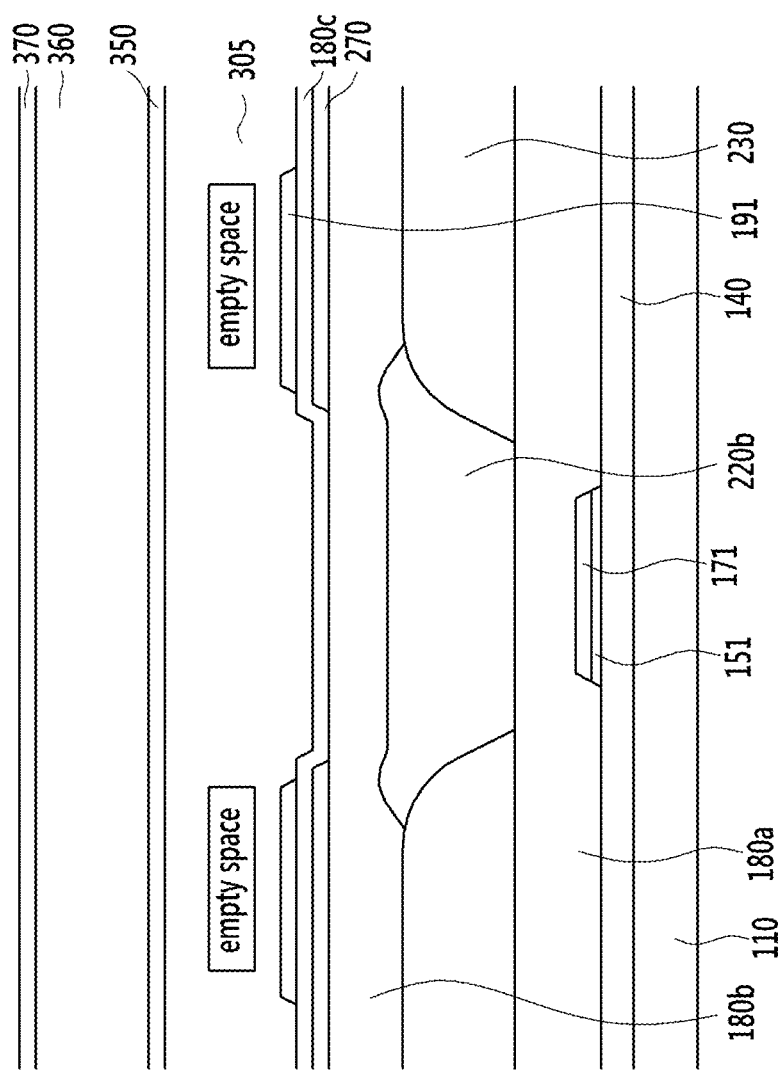
Figure 32:
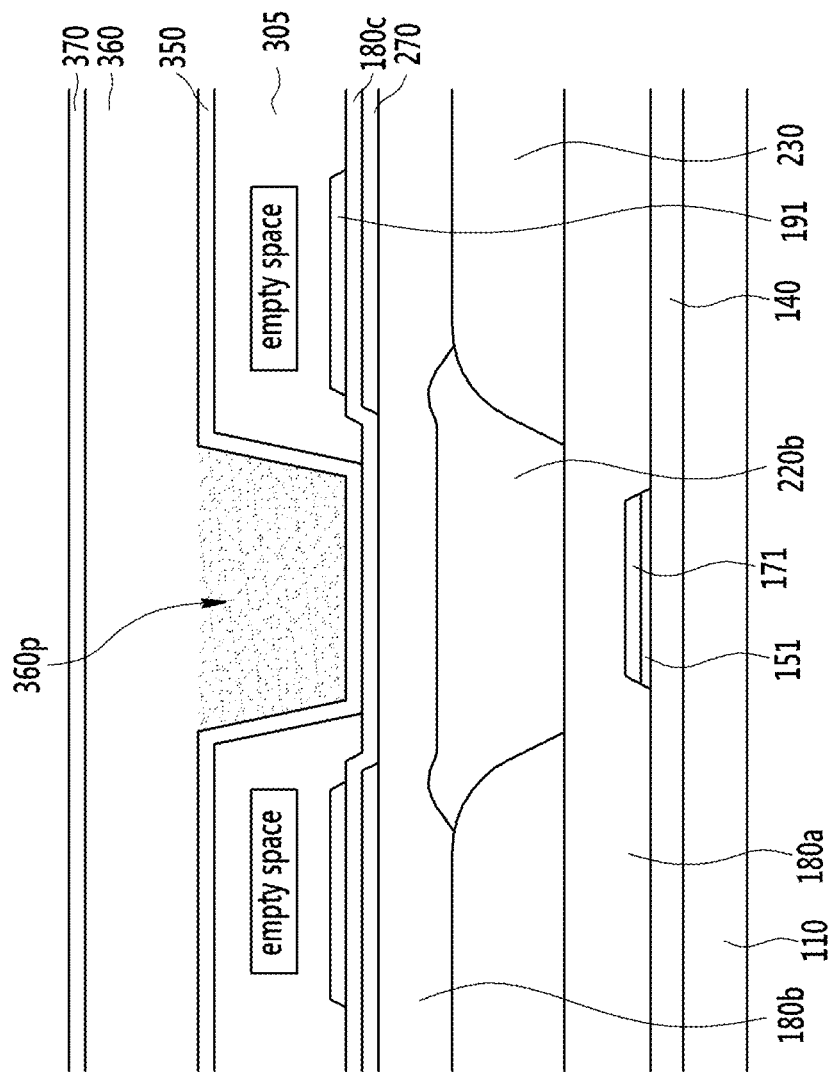
Figure 33:
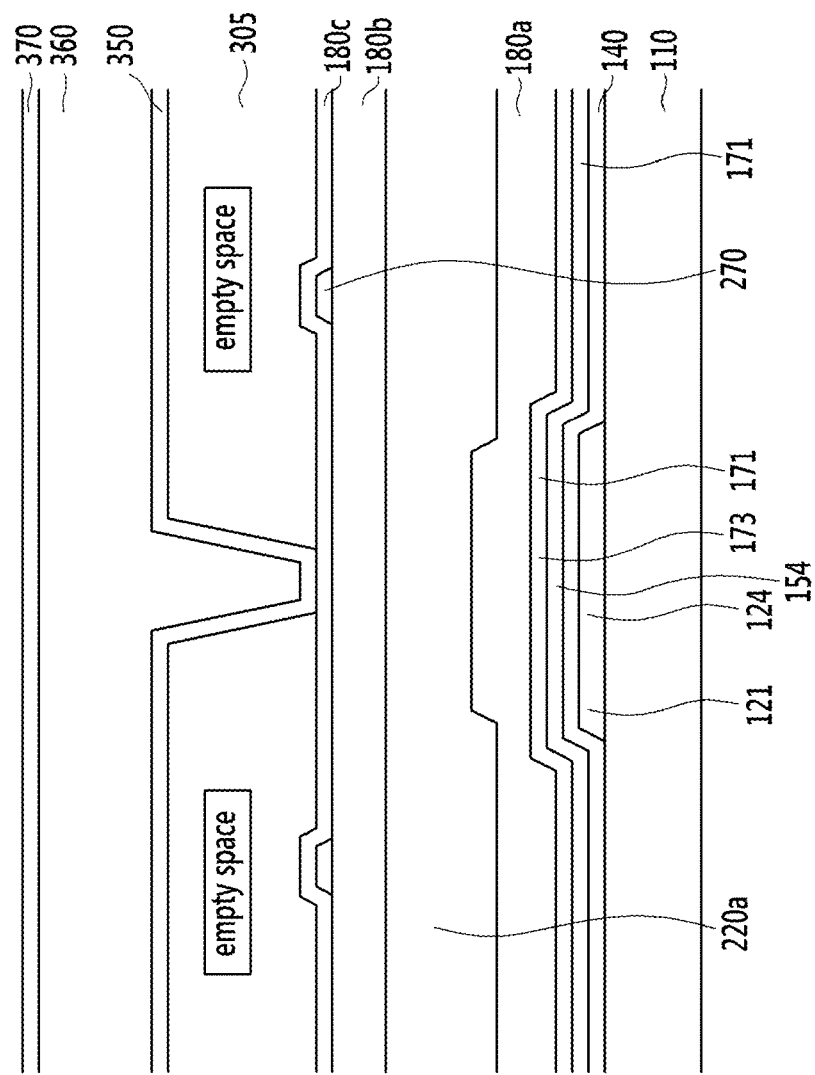
Figure 34:
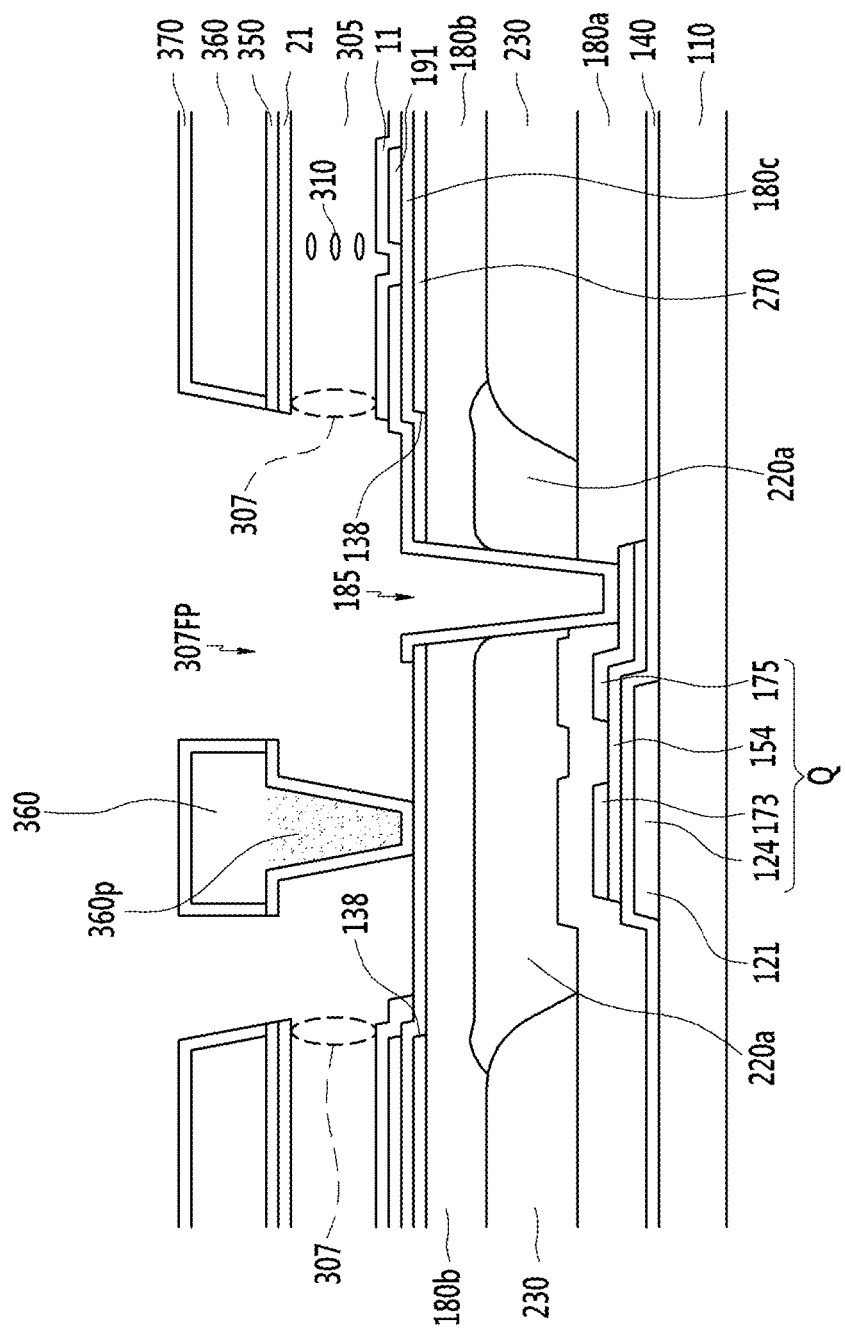
Figure 35:
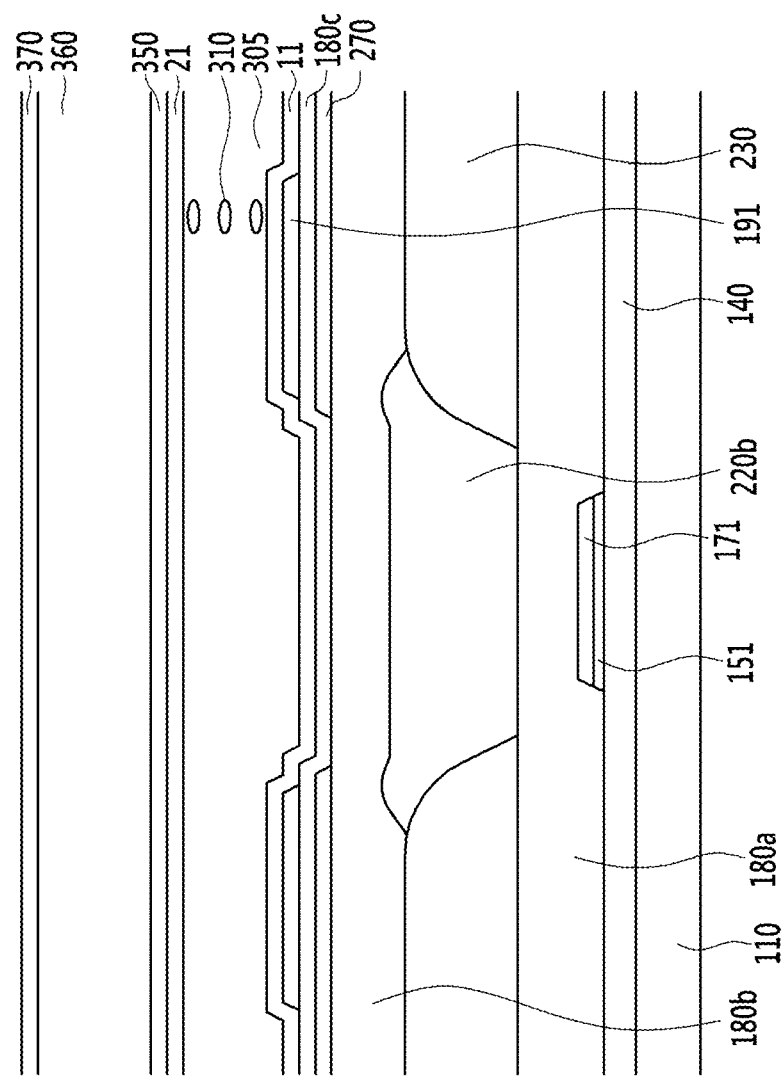
Figure 36:
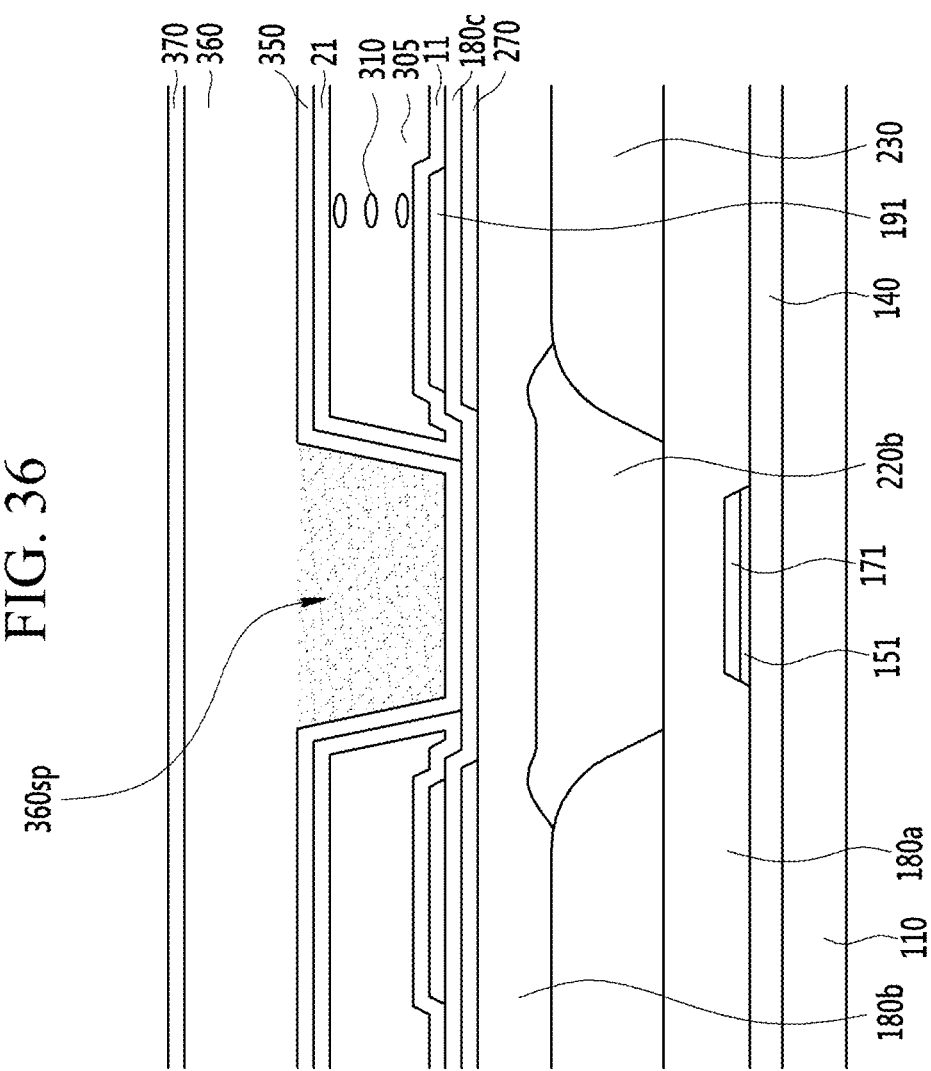
Figure 37:
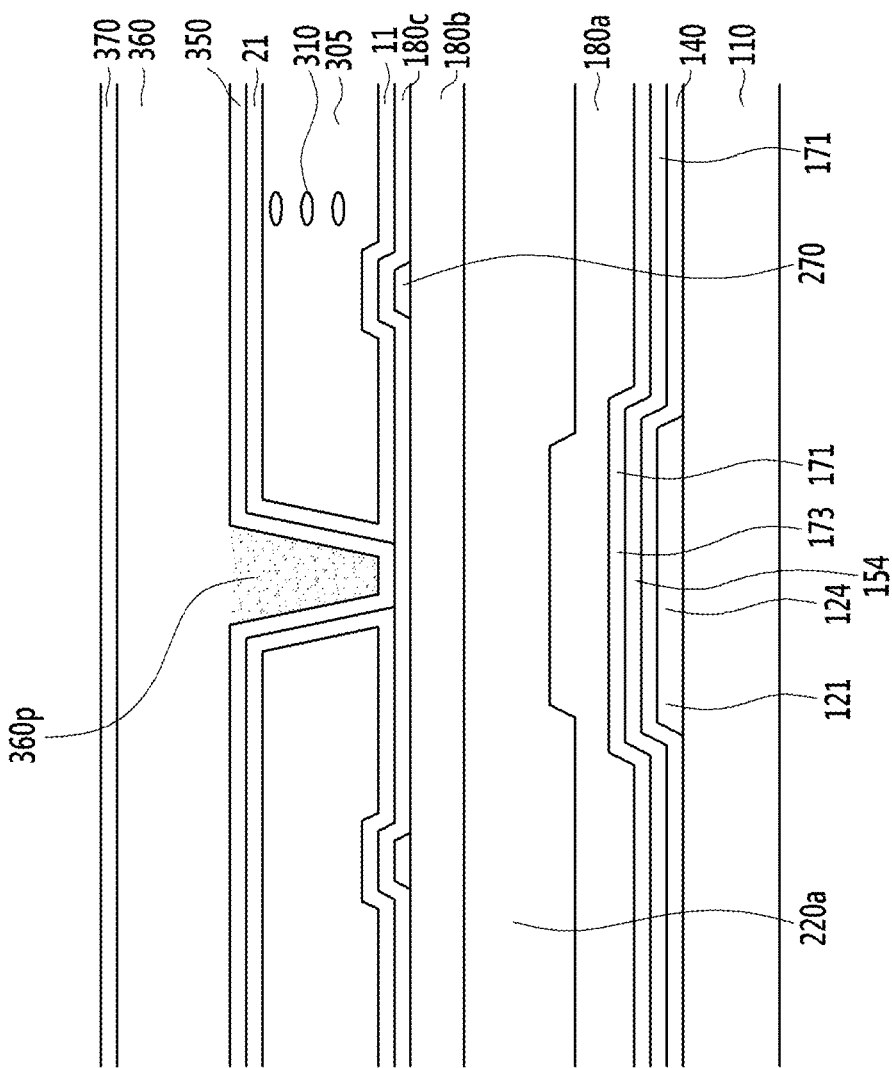

Referring to FIG. 29, the upper insulating layer 370 and the lower insulating layer 350 are dry-etched to partially remove the upper insulating layer 370 and the lower insulating layer 350, thereby forming the liquid crystal injection hole formation region 307FP. The liquid crystal injection hole formation region 307FP may be formed along the transverse light blocking member 220a. In this case, a plurality of columns 360p are formed at the liquid crystal injection hole formation region 307FP.

The upper insulating layer 370 covers the side of the roof layer 360. However, this is not a limitation of the inventive concept, and the upper insulating layer 370 covering the side of the roof layer 360 may be removed such that the side of the roof layer 360 is open.

Referring to FIG. 15 and FIG. 30 to FIG. 33, the sacrificial layer 300 is removed from the liquid crystal injection hole formation region 307FP by an oxygen (O2) ashing process or a wet etching process. After the sacrificial layer 300 is removed, an empty space is formed between the pixel electrode 191 and the roof layer 360. The space is formed at the display area of most of the liquid crystal display and may have a plurality of microcavities 305. Here, when the liquid crystal display includes the display area and the peripheral area, the peripheral area is a region corresponding to the driver, the display area is a region in which a plurality of gate lines and a plurality of data lines enclosed by the peripheral area, a plurality of thin film transistors, the pixel electrodes connected thereto, and the common electrode are formed.

The microcavity 305 is defined as a region corresponding to one pixel area in the above embodiments. However, this is not a limitation of the general inventive concept. For example, in other embodiments, the microcavity 305 may correspond to at least two pixel areas.

Referring to FIG. 15 and FIG. 34 to FIG. 37, an alignment material is injected through the liquid crystal injection hole 307 to form alignment layers 11 and 21 on the pixel electrode 191 and the lower insulating layer 350. In detail, the alignment material including a solid and a solvent is injected through the liquid crystal injection hole 307, followed by a bake process.

Next, a liquid crystal material including liquid crystal molecules 310 is injected through the liquid crystal injection hole 307 to the plurality of microcavities 305 by using an inkjet method. The liquid crystal molecules 310 may be aligned horizontally.

Next, the capping layer 390 is formed to cover the liquid crystal injection hole 307 and the liquid crystal injection hole formation region 307FP on the upper insulating layer 370, thereby forming the liquid crystal display like FIG. 1 to FIG. 6.

Figure 38:
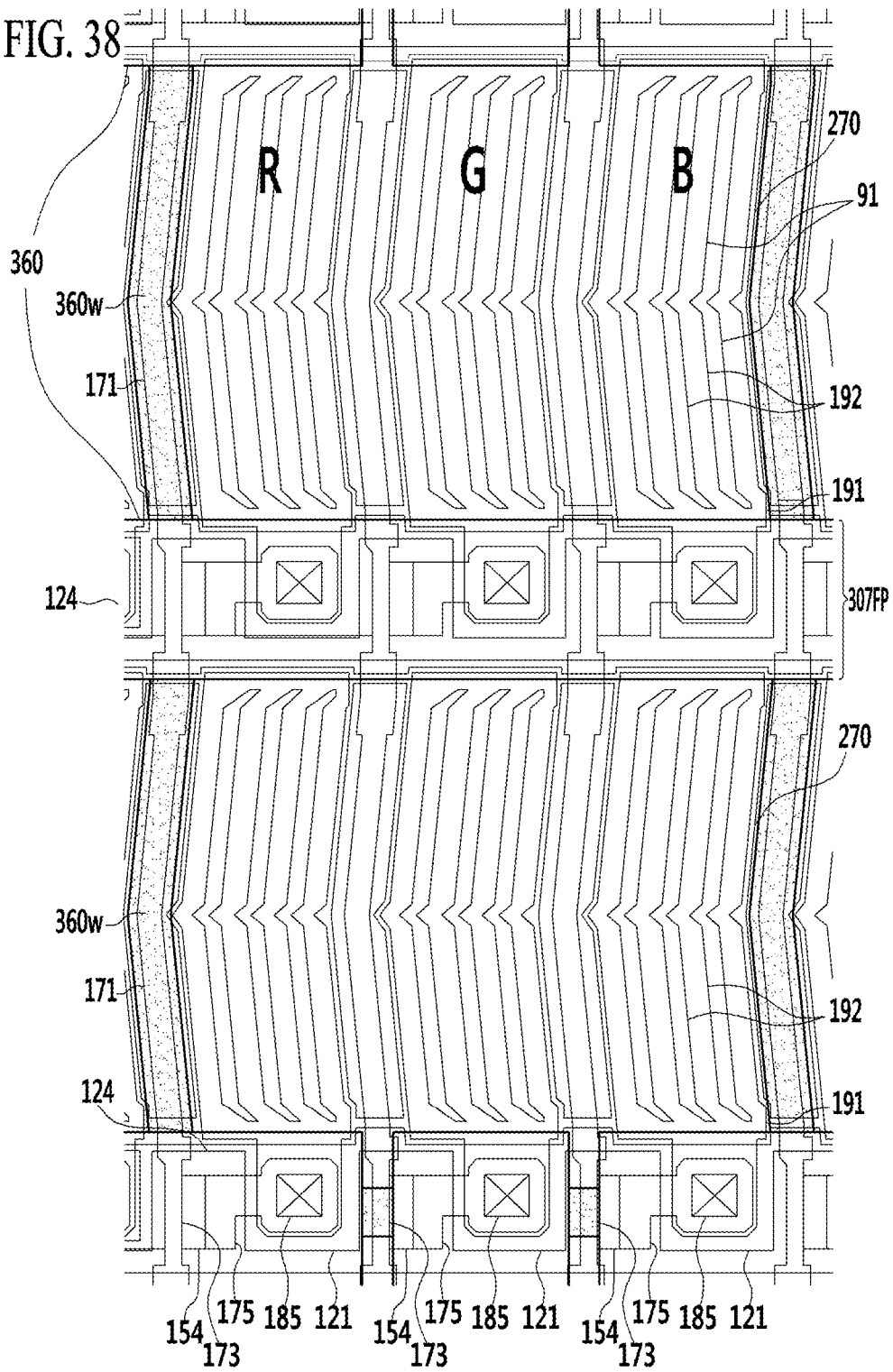
FIG. 38 is a top plan view of a liquid crystal display according to an exemplary embodiment of the present inventive concept.
Figure 39:
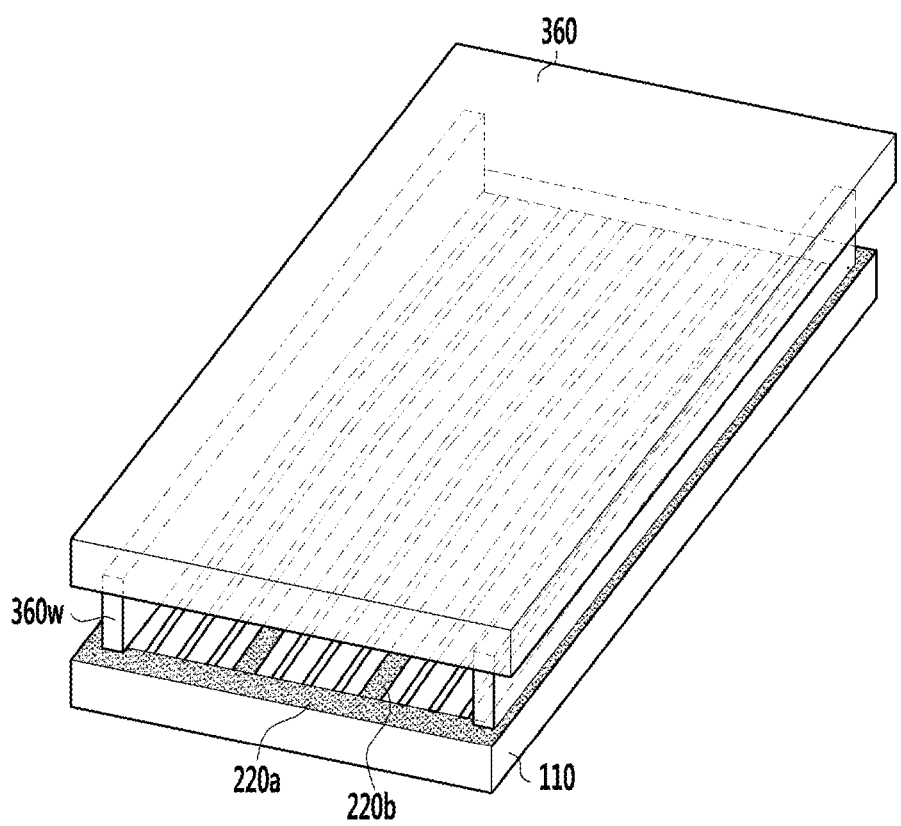
FIG. 39 is a schematic perspective view of an exemplary embodiment shown in FIG. 38.

FIG. 38 is a top plan view of a liquid crystal display according to an exemplary embodiment of the present inventive concept. FIG. 39 is a schematic perspective view of an exemplary embodiment shown in FIG. 38.

The exemplary embodiment depicted in FIG. 38 and FIG. 39 is similar to the exemplary embodiment depicted in FIG. 7 and FIG. 8, except for the plurality of columns 360p. Hereafter, differences will be described.

Referring to FIG. 38 and FIG. 39, in the present exemplary embodiment, the structure supporting the roof layer 360 includes a partition 360w. The liquid crystal display according to the present exemplary embodiment includes a plurality of unit pixels, each of which includes a first pixel area corresponding to a red pixel region R, a second pixel area corresponding to a green pixel region G, and a third pixel area corresponding to a blue pixel region B.

The unit pixel may be repeatedly arranged vertically and horizontally. The unit pixel includes a first unit pixel and a second unit pixel neighboring in the horizontal direction, the partition 360w is disposed between the first unit pixel and the second unit pixel, and the partition 360w extends generally in the direction of the data line 171.

General descriptions provided in reference to FIG. 7 to FIG. 8 may apply to the exemplary embodiment of FIG. 38 and FIG. 39 as well as the explicitly-described differences.

While this concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the disclosure.

<Description of symbols>

| | | | |
|---|---|---|---|
| 300 | sacrificial layer | 305 | microcavity |
| 307 | liquid crystal injection hole | 350 | lower insulating layer |
| 360 | roof layer | 360p | column |
| 360sp | assistance column | 360w | partition |
| 370 | upper insulating layer | 390 | capping layer |

What is claimed is:

1. A liquid crystal display comprising:
a substrate;
a gate line set overlapping the substrate;
a thin film transistor disposed on the substrate;
a pixel electrode connected to the thin film transistor;
a roof layer spaced from the pixel electrode;
a liquid crystal layer including liquid crystal molecules disposed in a plurality of microcavities between the pixel electrode and the roof layer, the plurality of microcavities corresponding to a plurality of pixels including a first pixel and a second pixel directly adjacent to each other along at least one gate line of the gate line set, wherein the gate line set includes a first gate line connected to the thin film transistor and includes a second gate line adjacent to the first gate line, and wherein there is only one row of pixels between the first gate line and the second gate line in a direction perpendicular to the first gate line;
a plurality of columns arranged along the first gate line and supporting the roof layer; and
an assistance column set supporting and directly contacting the roof layer, positioned in a middle region between the first gate line and the second gate line and separated from the plurality of columns,
wherein the columns are formed of the same material as the roof layer, comprise a first column corresponding to the first pixel, and comprise a second column corresponding to the second pixel,
wherein the microcavities include a first microcavity corresponding to the first pixel and include a second microcavity corresponding to the second pixel, and
wherein the first microcavity and the second microcavity are connected with each other to continuously accommodate the liquid crystal layer from the first pixel to the second pixel.

2. The liquid crystal display of claim 1, wherein the columns are integrated with the roof layer as one continuous body.

3. The liquid crystal display of claim 2, further comprising a data line set including a data line connected to the thin film transistor, wherein:
the assistance column set overlaps the data line set.

4. The liquid crystal display of claim 3, further comprising a first pixel area, a second pixel area, and a third pixel area disposed between the first gate line and the second gate line and adjacent to each other, wherein:
the data line set includes a first data line disposed between the first pixel area and the second pixel area and includes a second data line disposed between the second pixel area and the third pixel area; and
the assistance column set includes at least one first assistance column overlapping the first data line and includes at least one second assistance column overlapping the second data line.

5. The liquid crystal display of claim 4, wherein:
the plurality of columns arranged along the first gate line extend across the first pixel area and the third pixel area and be separated by the second pixel area.

6. The liquid crystal display of claim 5, wherein the first pixel area is a red pixel region, the second pixel area is a green pixel region, and the third pixel area is a blue pixel region.

7. The liquid crystal display of claim 3, wherein the assistance column set is disposed at a bent portion of the data line set.

8. The liquid crystal display of claim 3, wherein the columns are disposed at positions where the data line set and the first gate line cross each other.

* * * * *